(12) United States Patent
Ross et al.

(10) Patent No.: US 8,867,214 B2
(45) Date of Patent: Oct. 21, 2014

(54) MODULAR SERVER DESIGN FOR USE IN RECONFIGURABLE SERVER SHELF

(75) Inventors: Peter G. Ross, Olympia, WA (US); Darin Lee Frink, Lake Tapps, WA (US)

(73) Assignee: Amazon Technologies, Inc., Reno, NV (US)

( * ) Notice: Subject to any disclaimer, the term of this patent is extended or adjusted under 35 U.S.C. 154(b) by 152 days.

(21) Appl. No.: 13/327,573

(22) Filed: Dec. 15, 2011

(65) Prior Publication Data

US 2013/0155599 A1 Jun. 20, 2013

(51) Int. Cl.
*H05K 7/16* (2006.01)

(52) U.S. Cl.
USPC ............................ 361/727; 361/724; 361/725

(58) Field of Classification Search
USPC .......... 454/184; 361/724–727, 756, 825, 695; 211/208
See application file for complete search history.

(56) References Cited

U.S. PATENT DOCUMENTS

| | | | |
|---|---|---|---|
| 3,481,485 A | 12/1969 | Hess | |
| 3,807,572 A | 4/1974 | Luvara et al. | |
| 4,328,897 A | 5/1982 | Weiss | |
| 5,806,438 A * | 9/1998 | Beaudet | 108/107 |
| 5,871,396 A | 2/1999 | Shen | |
| 6,039,190 A | 3/2000 | Clausen | |
| 6,259,605 B1 | 7/2001 | Schmitt | |
| 6,469,899 B2 * | 10/2002 | Hastings et al. | 361/724 |
| 6,496,366 B1 | 12/2002 | Coglitore et al. | |
| 6,545,850 B1 | 4/2003 | Sheaman et al. | |
| 6,590,768 B1 | 7/2003 | Wiley | |
| 6,603,661 B2 | 8/2003 | Smith et al. | |
| 6,621,693 B1 | 9/2003 | Potter et al. | |
| 6,675,976 B2 | 1/2004 | Steinman et al. | |
| 6,754,082 B1 * | 6/2004 | Ding et al. | 361/727 |
| 6,791,836 B2 | 9/2004 | Cipolla et al. | |
| 6,795,314 B1 | 9/2004 | Arbogast et al. | |
| 6,822,859 B2 | 11/2004 | Coglitore et al. | |
| 6,833,995 B1 | 12/2004 | Hsue et al. | |
| 7,031,154 B2 | 4/2006 | Bash et al. | |
| 7,042,422 B2 | 5/2006 | Weitbruch et al. | |
| 7,068,509 B2 | 6/2006 | Bash et al. | |
| 7,238,104 B1 | 7/2007 | Greenslade et al. | |
| 7,283,358 B2 | 10/2007 | Campbell et al. | |
| 7,361,081 B2 | 4/2008 | Beitelmal et al. | |
| 7,379,299 B2 | 5/2008 | Walsh et al. | |
| 7,394,660 B2 * | 7/2008 | Hidaka | 361/727 |

(Continued)

FOREIGN PATENT DOCUMENTS

EP 2202751 6/2010

OTHER PUBLICATIONS

U.S. Appl. No. 12/717,282, filed Mar. 4, 2010, Peter G Ross.

(Continued)

*Primary Examiner* — Lisa Lea Edmonds
*Assistant Examiner* — Keith Depew
(74) *Attorney, Agent, or Firm* — Robert C. Kowert; Meyertons, Hood, Kivlin, Kowert & Goetzel, P.C.

(57) ABSTRACT

A modular computing system includes two or more electrical modules. The electrical modules may each include a module chassis having shelf mounting portions for sliding the electrical module into a slot of a rack. The electrical modules may couple with one another to form module assemblies that can be slid into one or more slots in a rack.

43 Claims, 13 Drawing Sheets

(56) References Cited

U.S. PATENT DOCUMENTS

| | | | |
|---|---|---|---|
| 7,403,390 B2 * | 7/2008 | Franz et al. | 361/695 |
| 7,408,775 B2 | 8/2008 | Walz et al. | |
| 7,499,286 B2 * | 3/2009 | Berke et al. | 361/756 |
| 7,599,183 B2 | 10/2009 | Dittus et al. | |
| 7,660,116 B2 | 2/2010 | Claassen et al. | |
| 7,660,117 B2 | 2/2010 | Werner et al. | |
| 7,701,710 B2 | 4/2010 | Tanaka et al. | |
| 7,719,835 B1 | 5/2010 | Schluter | |
| 7,746,634 B2 | 6/2010 | Hom et al. | |
| 7,768,780 B2 | 8/2010 | Coglitore et al. | |
| 7,768,787 B2 | 8/2010 | Vaughan et al. | |
| 7,862,410 B2 | 1/2011 | Mcmahan et al. | |
| 7,864,519 B2 * | 1/2011 | Lin et al. | 361/679.33 |
| 7,869,210 B2 | 1/2011 | Moss | |
| 7,878,888 B2 | 2/2011 | Rasmussen et al. | |
| 7,944,700 B2 * | 5/2011 | Wang et al. | 361/727 |
| 7,990,700 B2 | 8/2011 | Guo | |
| 8,087,979 B2 | 1/2012 | Rasmussen | |
| 8,089,754 B2 * | 1/2012 | Peng et al. | 361/679.48 |
| 8,477,491 B1 * | 7/2013 | Ross et al. | 361/679.5 |
| 2002/0134531 A1 | 9/2002 | Yanagida | |
| 2002/0181194 A1 | 12/2002 | Ho et al. | |
| 2004/0032722 A1 | 2/2004 | Wrycraft et al. | |
| 2004/0218355 A1 | 11/2004 | Bash et al. | |
| 2004/0233643 A1 | 11/2004 | Bolich et al. | |
| 2005/0166860 A1 | 8/2005 | Austin et al. | |
| 2005/0237716 A1 | 10/2005 | Chu et al. | |
| 2005/0257232 A1 | 11/2005 | Hidaka | |
| 2005/0265004 A1 | 12/2005 | Coglitore et al. | |
| 2006/0061955 A1 | 3/2006 | Imblum | |
| 2006/0250766 A1 | 11/2006 | Blaalid et al. | |
| 2006/0274496 A1 | 12/2006 | Lee et al. | |
| 2006/0290245 A1 | 12/2006 | Hidaka | |
| 2008/0013275 A1 | 1/2008 | Beckley et al. | |
| 2008/0043427 A1 | 2/2008 | Lee et al. | |
| 2008/0112127 A1 | 5/2008 | June et al. | |
| 2008/0191590 A1 | 8/2008 | Lin et al. | |
| 2008/0285232 A1 | 11/2008 | Claassen et al. | |
| 2009/0086441 A1 | 4/2009 | Randall et al. | |
| 2009/0109609 A1 | 4/2009 | Lai et al. | |
| 2009/0147494 A1 * | 6/2009 | Iida et al. | 361/818 |
| 2009/0260384 A1 | 10/2009 | Champion et al. | |
| 2009/0296322 A1 | 12/2009 | Yang et al. | |
| 2010/0271766 A1 | 10/2010 | Lin | |
| 2011/0149508 A1 | 6/2011 | Malekmadani | |
| 2011/0284422 A1 | 11/2011 | Yamada | |
| 2011/0310550 A1 * | 12/2011 | Xu et al. | 361/679.33 |
| 2012/0092811 A1 | 4/2012 | Chapel et al. | |
| 2012/0252344 A1 * | 10/2012 | Chien et al. | 454/184 |
| 2013/0135813 A1 * | 5/2013 | Jimenez et al. | 361/679.32 |

OTHER PUBLICATIONS

U.S. Appl. No. 12/751,206, filed Mar. 31, 2010, Michael W Schrempp.
U.S. Appl. No. 12/886,437, filed Sep. 20, 2010, Peter G Ross.
U.S. Appl. No. 12/886,440, filed Sep. 20, 2010, Peter G Ross.
U.S. Appl. No. 12/886,472, filed Sep. 20, 2010, Peter G Ross.
U.S. Appl. No. 12/886,469, filed Sep. 20, 2010, Peter G Ross.
U.S. Appl. No. 13/311,231, filed Dec. 5, 2011, Peter G Ross.
U.S. Appl. No. 13/327,576, filed Dec. 15, 2011, Peter G Ross.
U.S. Appl. No. 13/327,564, filed Dec. 15, 2011, Matthew T. Corddry.
International Search Report for PCT/US2011/051139, mailed Dec. 6, 2011, Amazon Technologies, Inc., pp. 1-10.
HP "Overview—HP ProLiant SL390s Generation 7 (G7)" Downloaded from http://h18004.www1.hp.com/products/quickspecs/13713_na/13713_na.html on Nov. 3, 2011 pp. 1-39.
Yael Maguire "Reflections on the Open Compute Summit" Facebook.com published Jun. 22, 2011, pp. 1-3.

* cited by examiner

MODULAR SERVER DESIGN FOR USE IN RECONFIGURABLE SERVER SHELF

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

In many server designs, the arrangement of the hard disk drives, circuit board assemblies, power supplies, and other components leaves a substantial amount of wasted space in the rack. This wasted space, especially when multiplied over many servers in a rack, may result in inadequate computing or storage capacity for a system. Moreover, in some rack systems, the density of computing devices achieved in a rack may be too low to utilize all of the resources available within the rack, such as data ports, electrical power, or cooling capacity.

In many server designs, each server has a fixed amount of computing capacity (for example, a fixed number of CPUs) and a fixed amount data storage capacity. In rack systems using such server designs, a computing system may not have the optimum mix of computing and data storage resources for a particular application. For example, a computing system may have a relative excess of compute capacity relative to data storage capacity, or vice versa.

Hard disk drives include motors and electronic components that generate heat. Some or all of this heat must be removed from the hard disk drives to maintain continuous operation of a server. The amount of heat generated by the hard disk drives within a data room may be substantial, especially if all of the hard disk drives are fully powered up at all times.

Electrical systems in racks consume resources such as electrical power, cooling, and network data exchange capacity. In a typical data center, each rack may have a limited amount of each resource available. If the electrical systems in a particular rack require more of a resource than is available to the rack, an overload may occur. For example, if too many electrical loads are plugged into a rack power distribution system, the power distribution system may fail (for example, a circuit breaker may trip) due to an overload.

Figure 1:
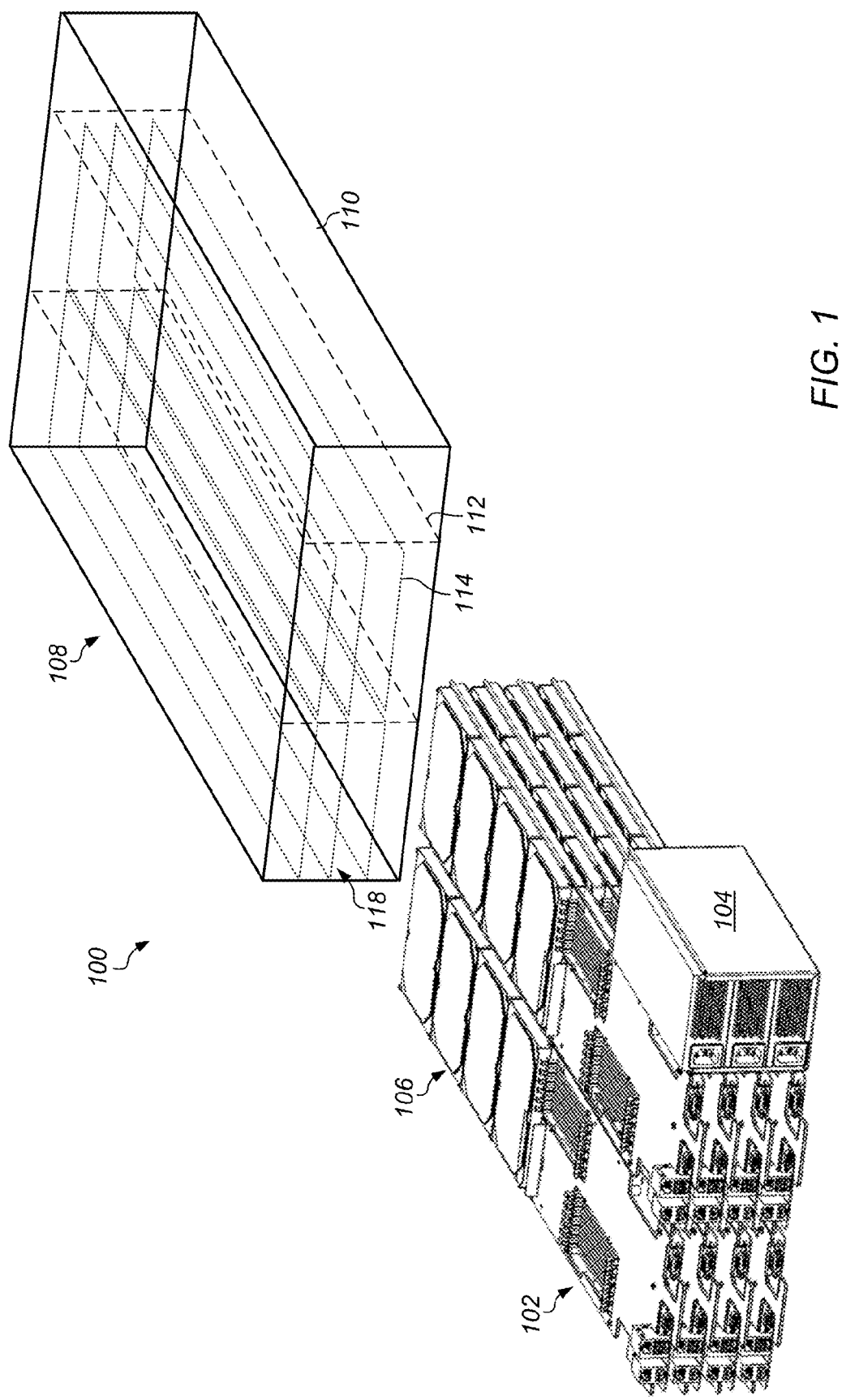
FIG. 1 is a partially exploded view illustrating one embodiment of a rack-mountable computing system that includes compute modules, data storage modules, and power modules on a common shelf module.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computing systems, and systems and methods for performing computing operations, are disclosed. According to one embodiment, a computing system includes a rack, a shelf module that couples to the rack, and two or more electrical modules. The shelf module includes two or more shelf members that form slots for receiving electrical modules. The shelf members are adjustable to alter the width of the slots. The shelf members may be adjustable to form a row of two or more partial width slots having a height that is a multiple of ¼ of a rack unit. The electrical modules may each include a chassis that couples with the shelf module. The electrical modules may be mounted in the partial width slots.

According to one embodiment, a computing system includes a shelf module and two or more electrical modules. The shelf module mounts in a rack. The shelf module includes shelf members that form partial width slots for receiving electrical modules. The shelf members are adjustable to alter the width and height of the slots. The electrical modules may each include a chassis that couples with the shelf module. The electrical modules may be mounted in the partial width slots.

According to one embodiment, a shelf module includes a frame that couples in a rack and two or more shelf members coupled to the frame. The shelf members can form partial width slots for receiving electrical modules. The shelf members are adjustable to alter the width and height of the slots.

According to one embodiment, a system includes a rack and two or more shelf-mounted computing systems coupled to the rack. Each of the shelf-mounted systems includes a shelf module and two or more electrical modules. The shelf module has adjustable shelf members. At least one of the shelf-mounted computing systems has a different slot arrangement than at least one other of the shelf-mounted computing systems in the rack.

According to one embodiment, a method of providing computing resources includes: positioning two or more shelf members to form partial width slots in a shelf module, and installing two or more electrical modules in the slots in the shelf module.

According to one embodiment, a modular computing system includes electrical modules including: one or more compute modules including a compute module chassis, one or more data storage modules including a data storage module chassis, and one or more power modules including a power module chassis, and a shelf module. The shelf module can be installed in rack. The shelf module includes partial width slots that can receive the compute modules, the data storage modules, and the power modules. At least some of the electrical modules can couple with one another to form module assemblies that can be received in the shelf module.

According to one embodiment, a modular computing system includes two or more electrical modules. The electrical modules may each include a module chassis having shelf mounting portions for sliding the electrical module into a slot of a rack. The electrical modules may couple with one another to form module assemblies that can be slid into one or more slots in a rack.

According to one embodiment, an electrical module includes a module chassis having shelf mounting portions and coupling portions. The shelf-mount portions can be used to mount the electrical module on a shelf. The coupling portions may couple the electrical module with one or more other electrical modules into a module assembly such that the coupled modules can be installed in a slot in a rack.

According to one embodiment, a compute module includes a sled having mounting portions, a circuit board assembly, a processor, and a data storage device (which may be a 3.5 inch hard disk drive). The mounting portions may be used to mount the compute module in a rack. The compute module has a height greater the compute module has a height greater than ½ U. The compute module may be installed in a ¾ U slot in a rack.

According to one embodiment, a method of providing computing resources includes coupling two or more electrical modules to one another to form one or more module assemblies. The coupled electrical modules in the module assemblies may include mounting portions to mount the module on rails in a slot of a rack. The coupled electrical modules are installed in a slot in the rack.

According to one embodiment, a method of allocating resources in a rack system includes assessing an available amount of one or more electrical power resources for a rack system and an available amount of one or more cooling resources for a rack system. For a defined amount of rack space in the rack system, budgeted amounts are established for one or more of the electrical power resources and one or more of the cooling resources. Electrical modules are deployed in a particular space in the rack system having the defined amount of rack space such that the amount of the electrical power resource used by the electrical modules in the particular rack space is maintained within the budgeted amount for the electrical power resource, and such that the amount of the cooling resource used by the electrical modules in the particular rack space is maintained within the budgeted amount of the cooling resource.

According to one embodiment, a method of allocating resources in a rack system includes establishing a budgeted amount of a resource for a defined amount of rack space in a rack system. One or more electrical modules are deployed in a particular space in the rack system having the defined amount of rack space such that the amount of the resource used by the one or more electrical modules in the particular rack space is maintained within the budgeted amount of the resource.

According to one embodiment, a method of allocating electrical power in a rack system includes establishing a budgeted amount of electrical power for a defined amount of rack space in a rack system, and deploying electrical modules in a particular space in the rack system having the defined amount of rack space such that the amount of the electrical power used by the electrical modules in the particular rack space is maintained within the budgeted amount of electrical power.

According to one embodiment, a method of allocating a cooling resource in a rack system includes establishing a budgeted amount of a cooling resource for a defined amount of rack space in a rack system; and deploying electrical modules in a particular space in the rack system having the defined amount of rack space such that the amount of the cooling resource used by the electrical modules in the particular rack space is maintained within the budgeted amount of the cooling resource.

As used herein, "chassis" means a structure or element that supports another element or to which other elements can be mounted. A chassis may have any shape or construction, including a frame, a sheet, a plate, a box, a channel, or a combination thereof. In some embodiments, a chassis is a sled that slides in and out the rack on a shelf or other mounting structure. In one embodiment, a chassis is made from one or more sheet metal parts. A chassis for a computing device may support circuit board assemblies, power supply units, data storage devices, fans, cables, and other components of the computing device.

As used herein, a "half-width computing device" means a computing device that is one-half the width or less of a standard rack slot. For purposes of this definition, the width of a computing device excludes mounting elements that extend laterally beyond the opening in the rack, such as side ears or tabs that contact a vertical mounting post of a rack during use.

As used herein, a "half-width chassis" means a chassis that is one-half the width or less of a standard rack slot. For purposes of this definition, the width of a chassis excludes mounting elements that extend laterally beyond the opening in the rack, such as side ears or tabs that contact a vertical mounting post of a rack during use.

As used herein, a "rack unit" or "U" refers to a measure of standard spacing in a rack. One "rack unit", or "U", is nominally 1.75 inches. As used herein, spacing, dimensions, and pitches based on "rack units" or "U" may allow for tolerances, such as manufacturing tolerances.

As used herein, "shelf" means any element or combination of elements on which an object can be rested. A shelf may include, for example, a plate, a sheet, a tray, a disc, a block, a grid, or a box. A shelf may be rectangular, square, round, or another shape. In some embodiments, a shelf may be one or more rails.

As used herein, "stack" includes any arrangement of elements in which one element is located at least partially above or over another element. For example, a stack of hard disk drives may include two or more hard disk drives arranged one over another. A "stack" does not require that upper elements in the stack rest on elements lower in the stack. For example, in some embodiments, each level of hard disk drives in a stack of hard disk drives is separately supported by a chassis or tray (for example, ledges in the walls of the chassis at each level of the stack). In addition, a "stack" does not require that elements be precisely aligned vertically with respect to one another. In some cases, a gap may be provided (such as an air gap) between elements in a stack. For example, an air gap may be provided between hard disk drives in a stack of hard disk drives.

As used herein, "standard" means consistent with one or more standards, such as an industry standard. In some embodiments, a standard rack slot is 19 inches wide.

As used herein, "air handling system" means a system that provides or moves air to, or removes air from, one or more systems or components.

As used herein, "air moving device" includes any device, element, system, or combination thereof that can move air. Examples of air moving devices include fans, blowers, and compressed air systems.

As used herein, an "aisle" means a space next to one or more elements, devices, or racks.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to devices including a processor, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "compute module" means a module that includes one or more computing devices.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, to "direct" air includes directing or channeling air, such as to a region or point in space. In various embodiments, air movement for directing air may be induced by creating a high pressure region, a low pressure region, or a combination both. For example, air may be directed downwardly within a chassis by creating a low pressure region at the bottom of the chassis. In some embodiments, air is directed using vanes, panels, plates, baffles, pipes or other structural elements.

As used herein, "member" includes a single element or a combination of two or more elements (for example, a member can include two or more sheet metal parts fastened to one another.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, a "module assembly" includes an assembly of two or more modules.

As used herein, "primarily horizontal" means more horizontal than vertical. In the context of an installed element or device, "primarily horizontal" includes an element or device whose installed width is greater than its installed height.

As used herein, "primarily vertical" means more vertical than horizontal. In the context of an installed element or device, "primarily vertical" includes an element or device whose installed height is greater than its installed width.

As used herein, a "rack" means a rack, container, frame, or other element or combination of elements that can contain or physically support one or more computing devices.

As used herein, a "rack space" means an amount of space in a rack. Rack space may be defined in terms of an area of the rack based on the height multiplied by the width. For example, a rack space may be defined by a width of a slot multiplied by the height of a slot. Rack space may correspond, for example, to the full width of slot in a standard rack multiplied by a number of rack units of height for the rack space. Thus, a slot that is half the width of a standard slot and 3.0 rack units in height has the same amount of rack space as a slot that is the full width of a standard slot and 1.5 rack units in height.

As used herein, "room" means a room or a space of a building. As used herein, "computer room" means a room of a building in which computing devices, such as rack-mounted servers, are operated.

In various embodiments, a computing system includes a rack, shelf modules in the rack, and electrical modules in the shelf modules. The shelf modules may be reconfigurable to receive different electrical modules. Shelf members in the shelf module may be configurable to form slots for receiving the electrical modules. In some embodiments, a shelf module is configurable to create slots having a height that is a multiple of ¼ of a rack unit. In one embodiment, a shelf module is configurable to create slots that are ¾ of a rack unit in height.

In certain embodiments, different electrical modules in a shelf module carry out different functions. For example, a computing system may include some modules that perform computing, some modules that store data, and some modules that provide power to other modules in the computing system. In some embodiments, modules serving different functions are assembled into module assemblies before installation in a rack. In some embodiments, sets of different modules in a rack may be decoupled and rearranged to create different module assemblies. In certain embodiments, a module may provide graphics functions for computing system.

In some embodiments, different modules in a module assembly are electrically coupled to one another. The coupled modules may combine to form a computing system. For example, a compute module may be physically and electrical coupled to two or more data storage modules and one power module. The power module in the module assembly may supply power to compute module and the data storage module. The compute module may access data on the data storage modules.

In some embodiments, a computing system includes compute modules with horizontally oriented circuit boards on chassis having a width that is half the width or less of a standard slot in a rack. The chassis may be, for example, half the width or less of a slot of a standard 19-inch rack in accordance with Electronic Industries Association EIA-310. Each compute module may be provided on a separate chassis. Two compute modules can be positioned one next to another, two or more deep (for example, one module behind another within a given slot), or both, at each of various levels in the rack.

In some embodiments, a computing system includes data storage modules on chassis having a width that is half the width or less of a standard slot in a rack. The chassis may be, for example, half the width or less of a slot of a standard 19-inch rack in accordance with Electronic Industries Association EIA-310. Each data storage module may be provided on a separate chassis. Two or more data storage modules can be positioned one next to another, two or more deep (for example, one module behind another within a given slot), or both, at each of various levels in the rack. Each data storage module may include one or more mass storage devices, such as hard disk drives. In some embodiments, the height of a data storage module is ¾ of a rack unit or less.

In some embodiments, a data storage module includes one or more stacks of two or more mass storage devices, such as hard disk drives. The height of the half width computing devices is more than 1 U. In one embodiment, the height of each computing device is about 1.5 U.

In some embodiments, a 3-rack unit shelf is subdivided into four ¾ rack unit levels. The shelf may include vertical partitions that can be moved horizontally to provide different width spaces to allow for multiple sled widths. Various sleds in a system may split a server as a whole unit into functional modules. Each sled may use multiples of ¾ rack units. Sleds for each of the functional modules may couple together (for example, latch to one another.) Power and data inter-connects may be provided between modules. In some embodiments, different modules have a common interface with a shelf (for example, a ¾ U, data storage module that is interchangeable with a ¾ U compute module or a ¾ U graphics module.) In certain embodiments, different combinations of sleds are mixed and matched to build multiple server SKUs from pre-qualified sleds.

FIG. 1 is a partially exploded view illustrating one embodiment of a rack-mountable computing system that includes compute modules, data storage modules, and power modules on a common shelf module. Computing system 100 includes compute modules 102, power module 104, data storage modules 106, and shelf module 108. Shelf module 108 may be mounted in a rack.

Shelf module 108 includes shelf frame 110, vertical shelf members 112, and horizontal shelf members 114. Shelf frame 110, vertical shelf members 112, and horizontal shelf members 114 may combine to define slots 118 in shelf module 108.

In some embodiments, the size, shape, and arrangement of slots in a shelf module may be altered by moving, adding, and subtracting shelf members. For example, in shelf module 108 shown in FIG. 1, vertical shelf members 112 and horizontal shelf member 114 may be adjustable in shelf frame 110. For example, vertical shelf members 112 may be repositionable along the width of shelf frame 110. Horizontal shelf members 114 may be repositionable along the width of shelf frame 110. In addition, vertical shelf members and horizontal shelf members may be added or removed.

Compute module 102, power module 104, and data storage modules 106 are supported in shelf module 108. Each of compute module 102, power module 104, and data storage modules 106 may have a separate chassis.

In some embodiments, a set of a modules in a slot of a shelf module are coupled with one other. The set of coupled modules may form a module assembly. For example, the set of modules in each of slots 118 shown in FIG. 1 may, in some embodiments be withdrawn from shelf module 108 together. In some embodiments, module assemblies are withdrawn by sliding the module assemblies out of the shelf toward the front of the rack.

In the embodiment shown in FIG. 1, each of slots 118 accommodates a single one of compute modules 102 and one data storage module 106 including four hard disk drives. In one embodiment, each compute module 102 is physically and electrically coupled to the one of data storage modules 106 in that same slot. In certain embodiments, however, a compute module may be coupled to, and access data on data storage modules that are in a different slot than the compute module. Moreover, a compute node may have any number of computing devices, hard disk drives, power supply units, or other components.

In some embodiments, a chassis for a compute module is less than or equal to half the width of a standard 19-inch rack. Thus, two compute modules may be mounted side-by-side in a full width standard slot of a rack. The width of the motherboard in compute modules 102 may be less than the width of the chassis. In one embodiment, the width of a motherboard for a compute module is about 6.3 inches.

Figure 2:
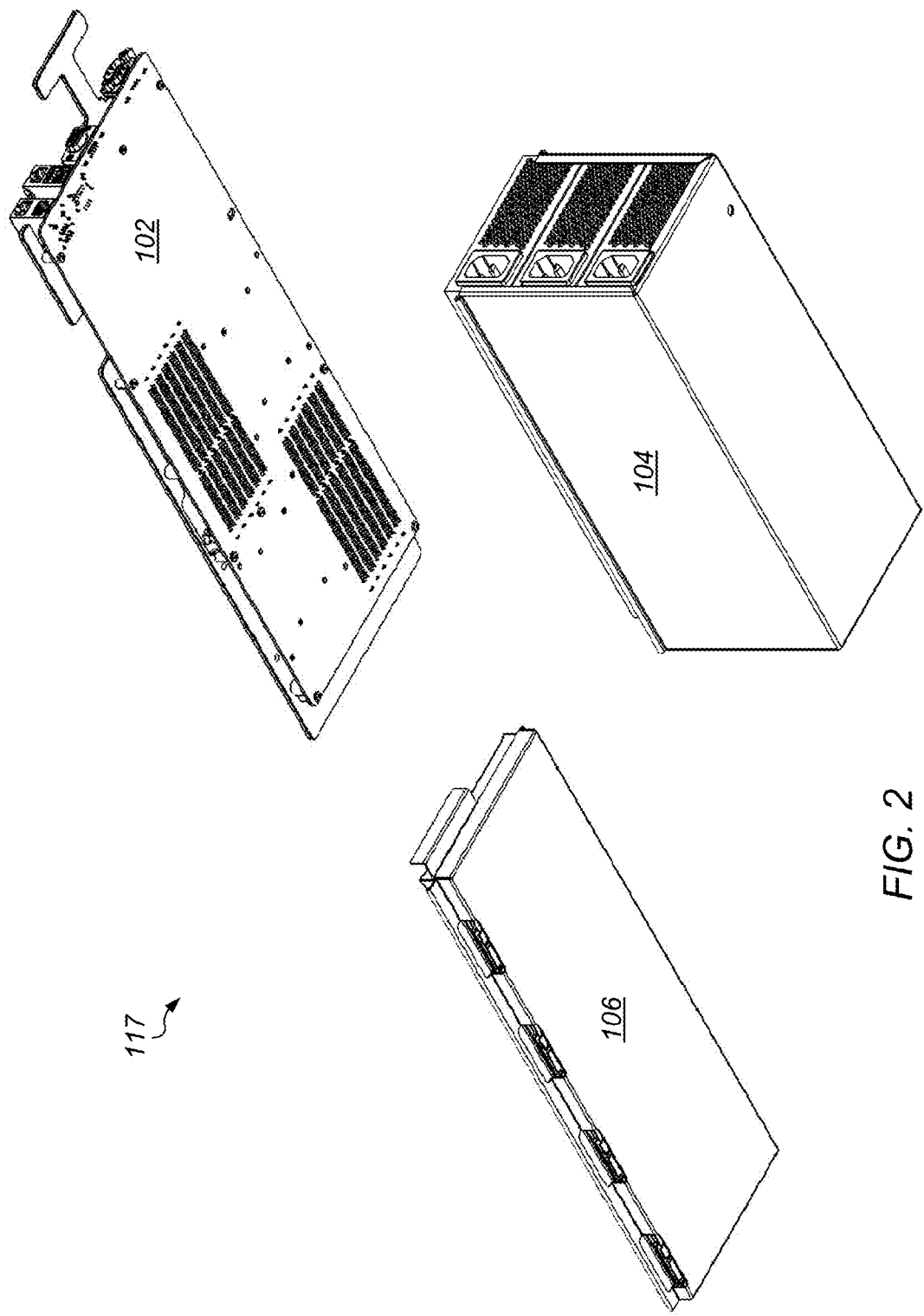
FIG. 2 illustrates one embodiment of electrical modules that can be installed in a rack system.

FIG. 2 illustrates one embodiment of electrical modules that can be installed in a rack system. Electrical modules 117 include compute module 102, power module 104, and data storage module 106. Each of electrical modules 117 may include its own mounting provisions, such as tabs or guides, to allow the electrical module to be independently installed in one or more slots in a shelf module or other mounting structure in a rack system.

Figure 3:
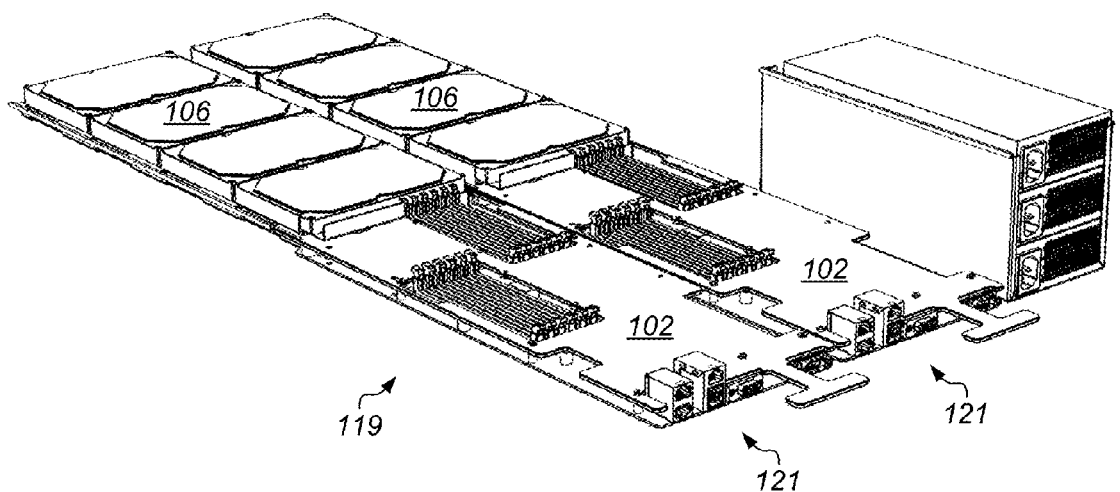
FIG. 3 illustrates one embodiment of a computing system including module assemblies.

Various combinations of one or more compute modules 102, one or more data storage modules 106, and one or more power modules 104 may be combined to operate as a computing system in a rack. In some embodiments, two or more of electrical modules 117 are coupled with one another to form a module assembly prior to installation in a rack system. FIG. 3 illustrates one embodiment of a computing system including module assemblies. Computing system 119 includes module assemblies 121 and power module 104. Module assemblies 121 each include compute module 102 and data storage module 106. Compute module 102 may be coupled to data storage module 106 before installing module assembly 121 in a slot in a rack system. Each of module assemblies 121 and power module 104 may be separately installed and removed from the rack system. Modules assemblies 121 may be installed such that the electrical modules are two-deep or more in the rack. Module assemblies 121 may be installed such that data storage module 106 are inserted in the same slot, with data storage module 106 entering the slot before compute module 102 is inserted into the same slot.

In certain embodiments, chassis of adjacent modules include complementary coupling portions. The complementary coupling portions can be used to connect the modules with one another. In certain embodiments, adjacent modules have interlocking features to couple the modules to one another. For example, coupling portions of adjoining chassis may have interlocking grooves, channels, ridges, lips, buttons, sockets, or the like. In one embodiment, adjacent modules snap-together. In certain embodiments, complementary coupling portions of adjacent modules couple in an interference fit.

Figure 4:
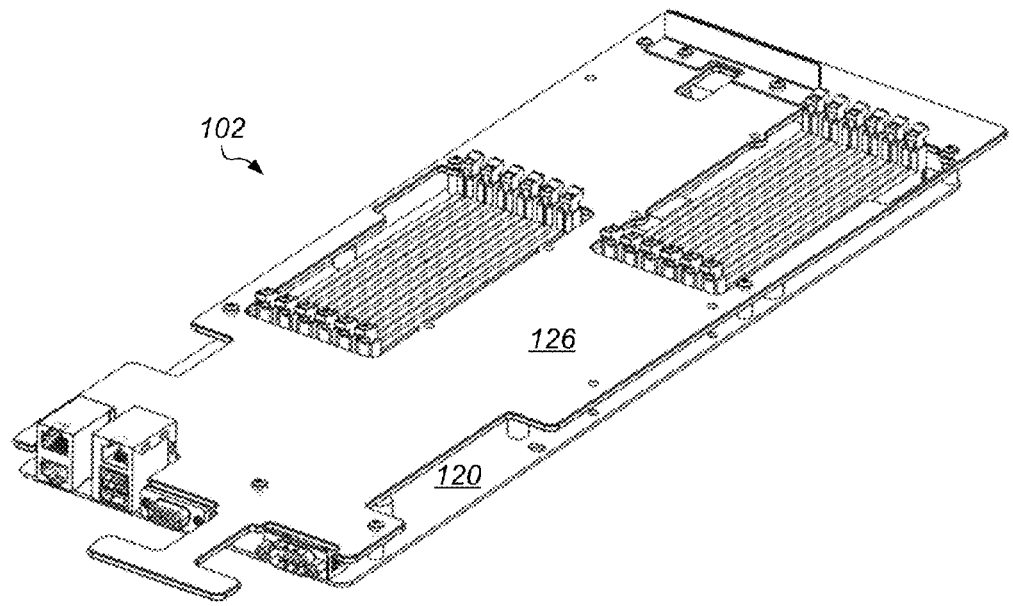
FIG. 4 illustrates one embodiment of a compute module that may be installed in a shelf module.
Figure 5:
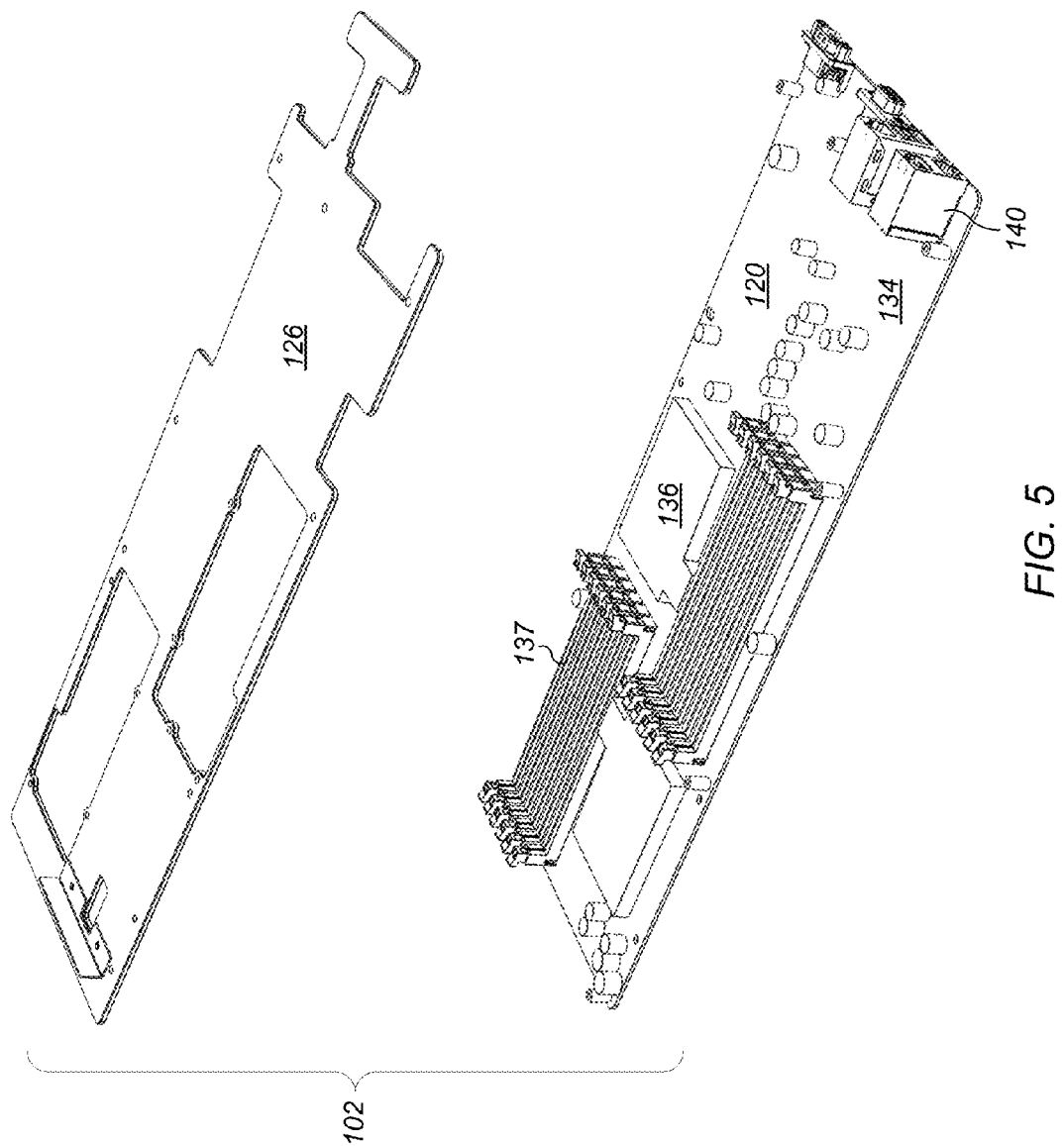
FIG. 5 illustrates is a partially exploded view of a compute module according to one embodiment.

FIG. 4 illustrates one embodiment of a compute module that may be installed in a shelf module. FIG. 5 illustrates is a partially exploded view of the compute module shown in FIG. 4 according to one embodiment. Each of compute modules 102 may serve as one or more compute nodes for the system. Compute module 102 includes motherboard assembly 120. Motherboard assembly 120 may be coupled to data storage devices in a disk drive array of a data storage module, such as data storage module 106. Motherboard assembly 120 may control, and access data on, hard disk drives in the disk drive array.

Motherboard assembly 120 includes circuit board 134, processors 136, DIMM slots 137, and I/O connectors 140. Motherboard assembly 120 may include various other semiconductor devices, resistors, and other heat producing components. Motherboard assembly 120, along with other components of chassis 126 and/or components external to chassis 126, may operate in conjunction with one another and external components, such as hard disk drives, as a computing device. For example, compute module 102 may be a file server.

As illustrated in FIG. 5, a computing device may have more than one processor. In some embodiments, two or more processors are provided on a single motherboard assembly. In certain embodiments, the processors are staggered across the width of the motherboard assembly. In one embodiment, rows of DIMMs are placed in complementary staggered positions relative to staggered processors. For example, in FIG. 5, staggered rows of DIMMs are located in a complementary arrangement relative to processors 136.

In some embodiments, heat sinks are mounted on each of processors 136. Heat sinks may transfer heat from processors 136 to air passing over compute module 102 during operation of compute module 102. DIMMs may be installed in any or all of DIMM slots 137 on motherboard assembly 120. In some embodiments, the DIMMs are low-profile DIMMs. In one embodiment, DIMMS are installed such that the total height of compute module 102 can be installed in a slot having a height of ¾ rack units.

Motherboard assembly 120 may be attached to chassis 126 in any suitable manner. In one embodiment, the motherboard assemblies are attached to the chassis using screws.

In the embodiment shown in FIGS. 4 and 5, chassis 126 is in the form of a sled on which components of compute module 102 may be mounted. In other embodiments, a chassis is in the form of an enclosure that houses motherboard assembly 120 and other components of compute module 102. Chassis 126 includes cutouts for DIMMs in DIMM slots 137. In some embodiments, chassis 126 includes cutouts for processors 136 and/or heat sinks for processors 136.

In some embodiments, chassis 126 may conduct heat away from processors 136 and other heat producing components. In certain embodiments, chassis 126 transfer heat from processors 136 to thermally conductive elements of a shelf module or rack.

Figure 6:
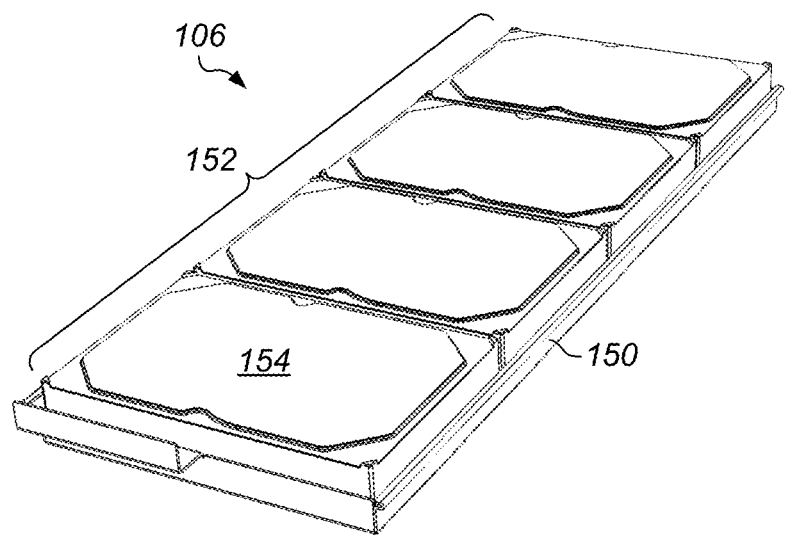
FIG. 6 illustrates one embodiment of a data storage module.

FIG. 6 illustrates one embodiment of a data storage module. Data storage module 106 includes data storage module chassis 150 and hard disk drive array 152. Hard disk drive array 152 includes hard disk drives 154.

In some embodiments, hard disk drives 154 are standard, off-the-shelf disk drives. Examples of suitable hard disk drive form factors may include 3.5", 5.25", and 2.5". In one embodiment, a 3.5-inch hard disk drive is provided at each of the three hard disk drive locations shown in FIG. 6.

In some embodiments, hard disk drives are mounted in a computing device in a cross-wise direction relative to the direction of installation of the computing device. For example, in FIG. 6, hard disk drives 154 are mounted the length-wise direction of the hard disk drives runs perpendicular to the direction of installation of data storage module 106.

In certain embodiments, a computing device includes mass storage devices that are mounted in two or more different orientations. In one embodiment, a computing device includes one or more hard disk drives mounted in a horizontal orientation and one or more hard disk drives mounted in a vertical orientation.

Hard disk drives 154 may be attached to chassis 150 in any suitable manner. In one embodiment, the hard disk drives are attached to the chassis using screws. In some embodiments, hard disk drives are installed in disk drive carriers that allow each hard disk drive to be separately removed from the carrier while the carrier is installed on a chassis.

Figure 7:
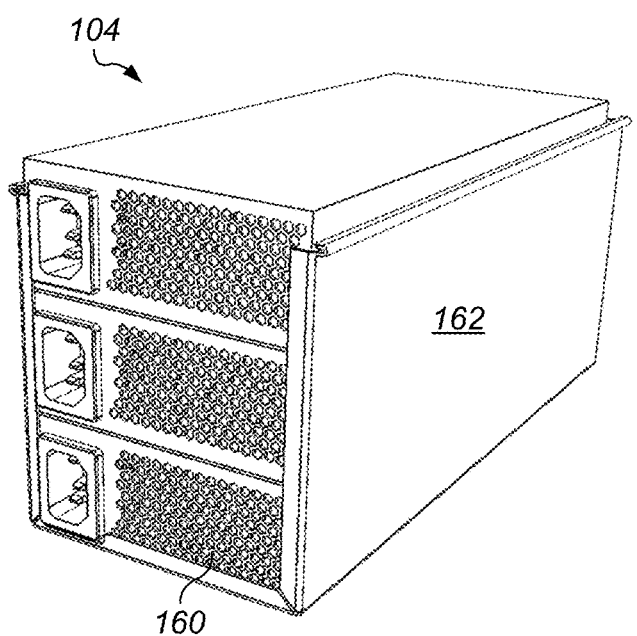
FIG. 7 illustrates one embodiment of a set of power modules.

FIG. 7 illustrates one embodiment of a set of power modules. Power modules 160 are supported on power module carrier 162. Power modules 160 may supply electrical power for processors, hard disk drives, and other components of electrical modules in a computing system. In one embodiment, each of power modules 160 is a 1 U power supply unit. Power modules 160 may be withdrawn from a shelf module on power module carrier 162.

In various embodiments, a computing system includes a power supply that conforms to an industry-recognized standard. In some embodiments, a power supply for a computing system has a form factor in accordance with an industry-recognized standard. In one embodiment, power module 160 is a power supply unit having a standard 1 U form factor. Examples of other standards for a power supply and/or a power supply form factor include 2 U, 3 U, SFX, ATX, NLX, LPX, or WTX.

In some embodiments, modules in computing system receive power from one or more power distribution circuit boards instead of, or in addition to, a power supply unit. For example, a power distribution board may be provided for compute modules 102 instead of a power supply unit.

In certain embodiments, a power supply is external to a computing device. For example, in certain embodiments, motherboard assembly 120 may receive power from a power supply external to computing the computing system (such as a rack-level power supply), and a power supply unit may be omitted.

Figure 8:
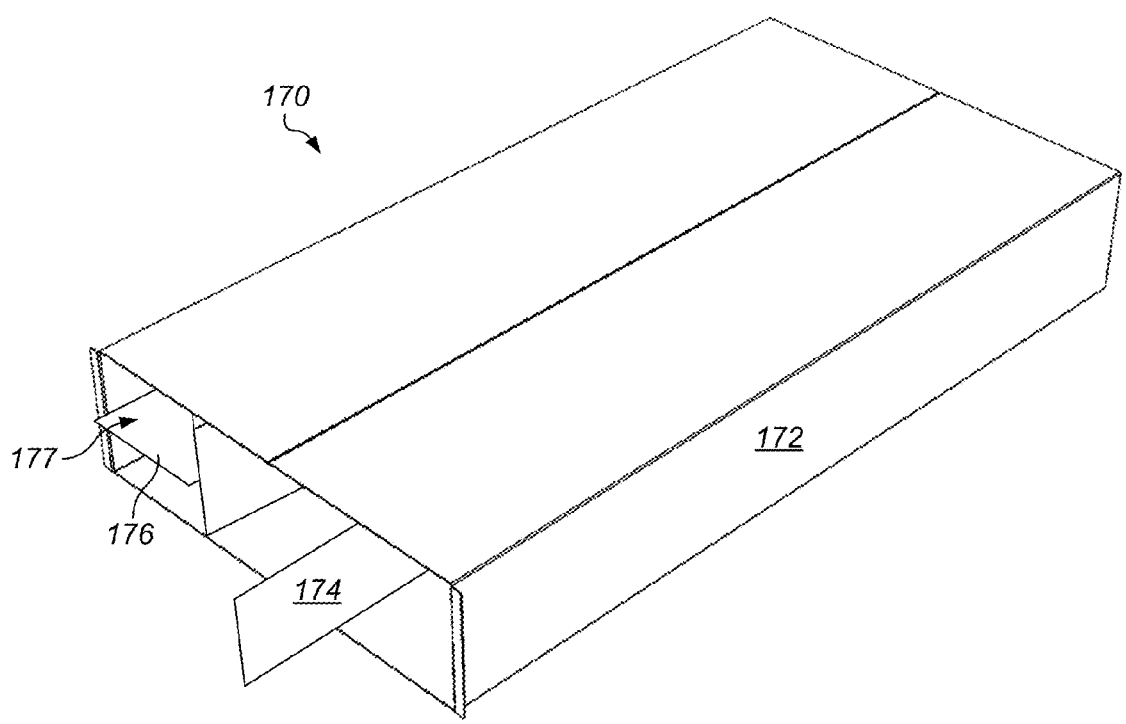
FIG. 8 illustrates one embodiment of a shelf module for a computing system.

FIG. 8 illustrates one embodiment of a shelf module for a computing system. Shelf module 170 includes shelf frame 172, vertical shelf member 174, and horizontal shelf member 176. One or more of vertical shelf members 174 and one or more of horizontal shelf members 176 may be positioned in shelf frame 172 to form slots 177 in shelf module 170. For example, vertical shelf members 174 and horizontal shelf members 176 may be positioned to form slots as shown for the shelf module shown in FIG. 1. In some embodiments, shelf members include tabs, guides, or rails that can support or engage with corresponding elements on electrical modules of a computing system.

Components of shelf module 170 may be made of sheet metal or other suitable material or combination of materials. In one embodiment, the external walls of shelf frame 172 have a uniform cross section from the front edge of the shelf module to the back edge of the shelf module. In some embodiments, exterior walls and/or vertical members of a shelf module provide structural support, environmental protection, and EMI shielding for electronic devices in the computing devices.

Figure 9:
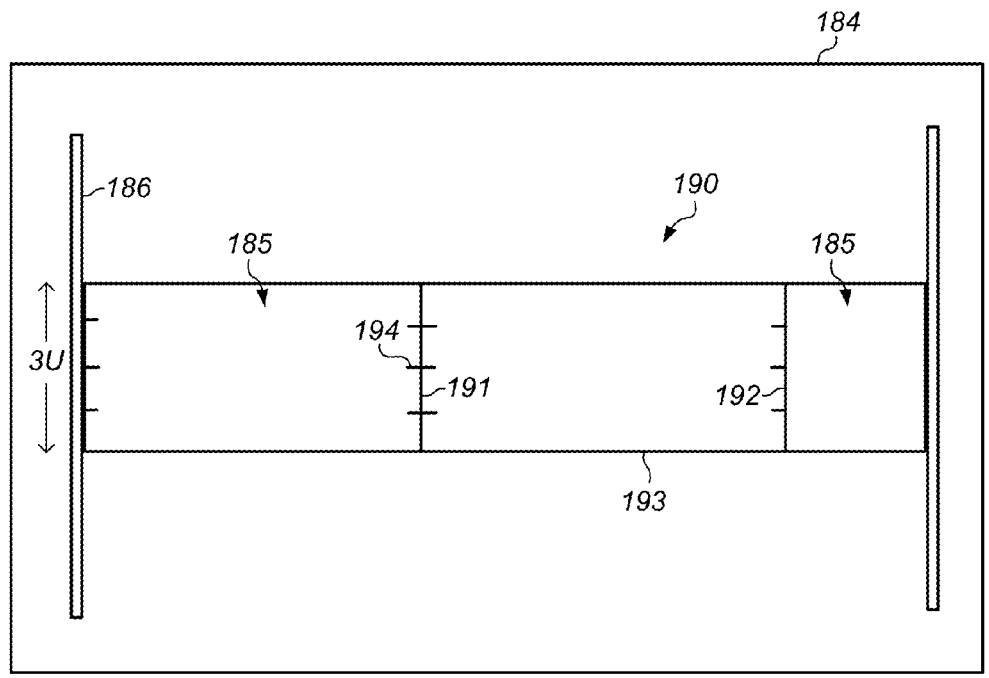
FIG. 9 illustrates one embodiment of a shelf module including separate slots for multiple partial width computing devices and a slot for a power supply module.

FIG. 9 illustrates one embodiment of a shelf module including separate slots for multiple partial width computing devices and a slot for a power supply module. The shelf module may support, for example, the system of partial-width compute modules and power module shown in FIG. 1. Rack 184 includes posts 186. Posts may include front posts and rear posts on each side of the rack. One or more shelf modules 190 may be rack-mountable in rack 184. Each of shelf modules 190 may be attached to posts 186 in any of various manners, including threaded fasteners, opposing L-rails, brackets, clips, slides, cross-rails, bars or shelves. In one embodiment, a shelf module is supported on opposing left and right L-rails coupled to the front and rear posts of a rack. In one embodiment, rails are installed on the left and right sides of shelf module 190 to engage on corresponding rails, slides, or ledges, on left and right sides of a rack. In certain embodiments, a rail kit may be installed on the sides of the shelf for the computing devices.

Shelf module 190 includes dividers 191 and 192, base shelf 193, and support rails 194. In one embodiment, shelf module 190 is mounted in slots in a standard 19 inch rack. Shelf module 190 may have a height of about 3 U. In some embodiments, dividers 191 and 192 can be adjusted from one position to another in shelf module 104. In certain embodiments, support rails 194 are adjustable (for example, to adjust the height of the slots). In one embodiment, support rails 194 are adjustable in increments of ¼ rack units.

In one embodiment, each of slots 185 receives a module of up to ¾ U and slot 186 can receive a module of up to about 3 U in height. Thus, electrical modules stacked in slots 185 and electrical modules in slot 186 may both take up the same amount of vertical space in the rack.

In some embodiments, electrical modules for a computing system can be received in slots whose height can be adjusted in increments that correspond to a standard number of rack units. In one embodiment, a shelf module is adjustable in increments that are a multiple of ¼ rack units. For example, a shelf module for may be adjustable into slots having a ½ U height, ¾ U height, and 1 U height, or multiples thereof. In one embodiment, a shelf module is adjustable in increments in multiples of ¾ U. For example, a shelf module may be adjustable to create slots of ¾ U, 1½ U, and 3 U.

Figure 10:
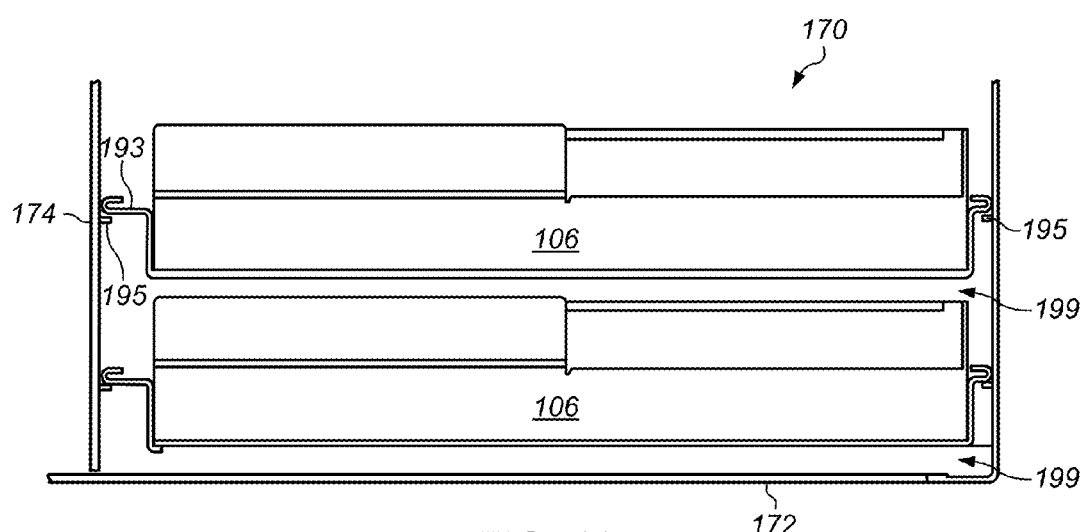
FIG. 10 illustrates one embodiment of mounting of data storage modules in a shelf module.

FIG. 10 illustrates one embodiment of mounting of data storage modules in a shelf module. Data storage modules 106 may be installed in slots 177 of shelf module 170.

Shelf frame 172 and vertical shelf member 174 each include rails 195 for supporting data storage modules 106. Data storage modules 106 may be supported, for example, on guides 193 of the data storage modules. Vertical shelf members 174 may be horizontally adjustable in shelf frame 172, such that the width of the slot can be altered to accommodate modules of different widths. In some embodiments, rails 195 are vertically adjustable on of shelf frame 172, vertical shelf member 174, or both. In some embodiments, rails 195 are formed as tabs in a sheet metal chassis.

When data storage modules 106 are installed in shelf module 170, air gaps 199 may exist under each of the sets of hard disk drives in data storage modules 106. Air gaps 199 may allow air to pass across heat producing components in data storage modules 106.

In some embodiments, the size, shape, arrangement, and location of slots in a shelf module are altered by reconfiguring the shelf module. The reconfigured shelf module may accommodate a computing system having a different set of electrical modules. For example, additional compute modules may be included in a system to add compute capacity to a computing system. As another example, additional data storage modules may be included in a system to add data storage capacity to a computing system.

Figure 11:
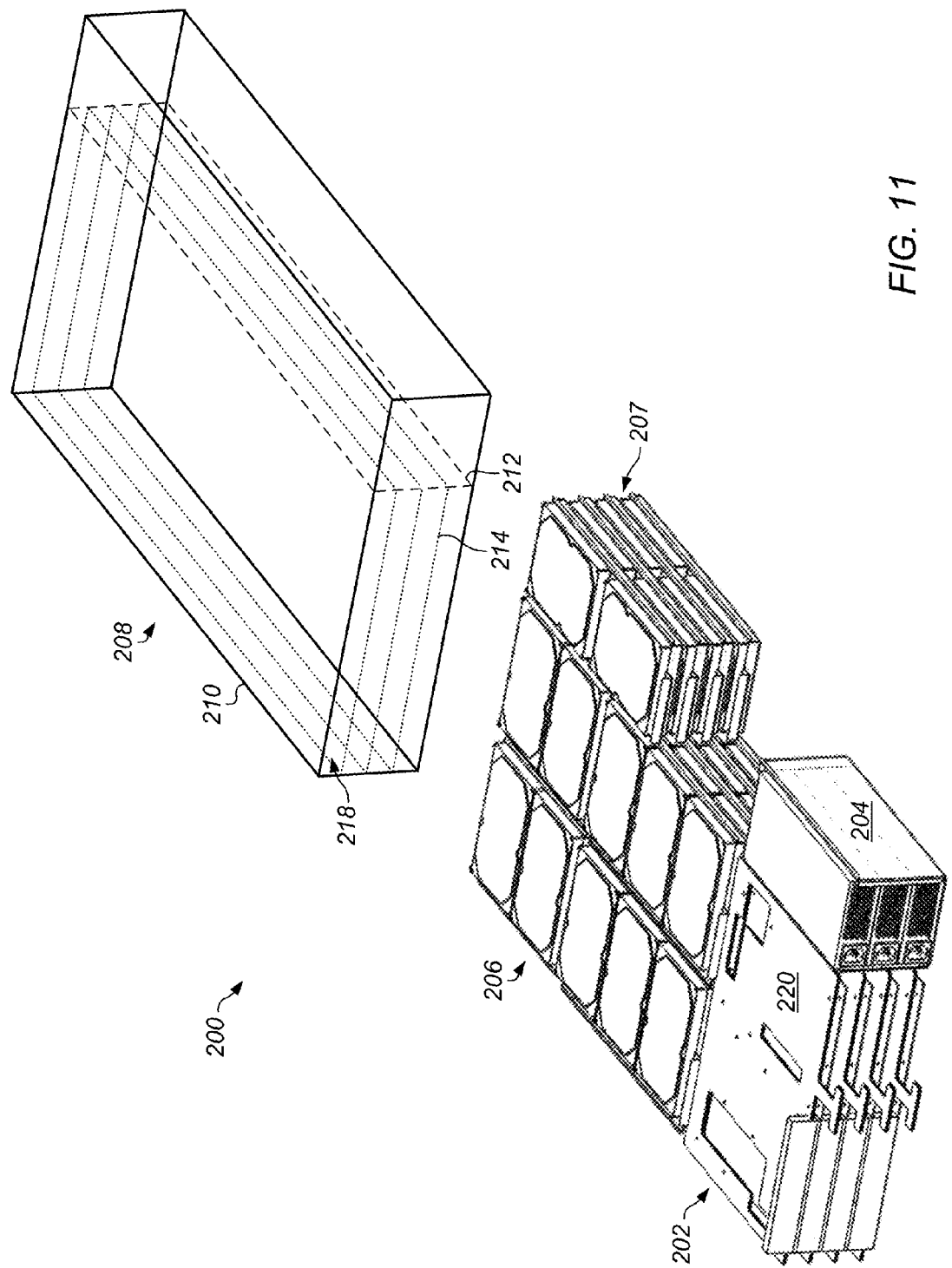
FIG. 11 illustrates a computing system having modules in another arrangement.

FIG. 11 illustrates a computing system having modules in a different arrangement from that shown in FIG. 1. Computing system 200 includes compute modules 202, power module 204, data storage modules 206, data storage modules 207, and shelf module 208. Shelf module 208 may be mounted in rack.

Shelf module 208 includes shelf frame 210, vertical shelf members 212, and horizontal shelf members 214. Various portions of shelf frame 210, vertical shelf members 212, and horizontal shelf members 214 may define slots 218 in shelf module 208.

In some embodiments, shelf module 208 is produced by rearranging one or more shelf elements. For example, shelf module 208 may be reconfigured from elements of shelf module 108 shown in FIG. 1. In this case, shelf module 108 and the right vertical shelf member 114 can be used as elements of shelf module 208.

Compute modules 202 may have similar electrical components as data storage module 108 described above relative to FIGS. 4 and 5. Chassis 220 and circuit board assemblies in compute modules 202 may have a different form factor from that of chassis 126 shown in FIGS. 4 and 5. For example, compute modules 202 and their corresponding slot 218 may be about twice the width of compute module 102 and slots 118.

Electrical modules may be provided and connected to meet different needs for different computing systems. For example, each of the four compute modules shown in FIG. 11 may be coupled to, and access data from, a total of 12 hard disk drives, while each of compute modules 102 shown in FIG. 1 may be coupled to, and access data from, four hard disk drives.

Although in FIG. 11, the shelf module is shown with a three column arrangement for illustrative purposes, a shelf module may include any number of rows and columns. For example, a shelf module may include three rows (three levels of computing devices) and three columns (three computing devices arranged side-by side at each level).

Although only one shelf module is shown in FIG. 11 for illustrative purposes, shelf modules and electrical modules may be installed to fill any or all of the slots from top to bottom in a rack.

Figure 12:
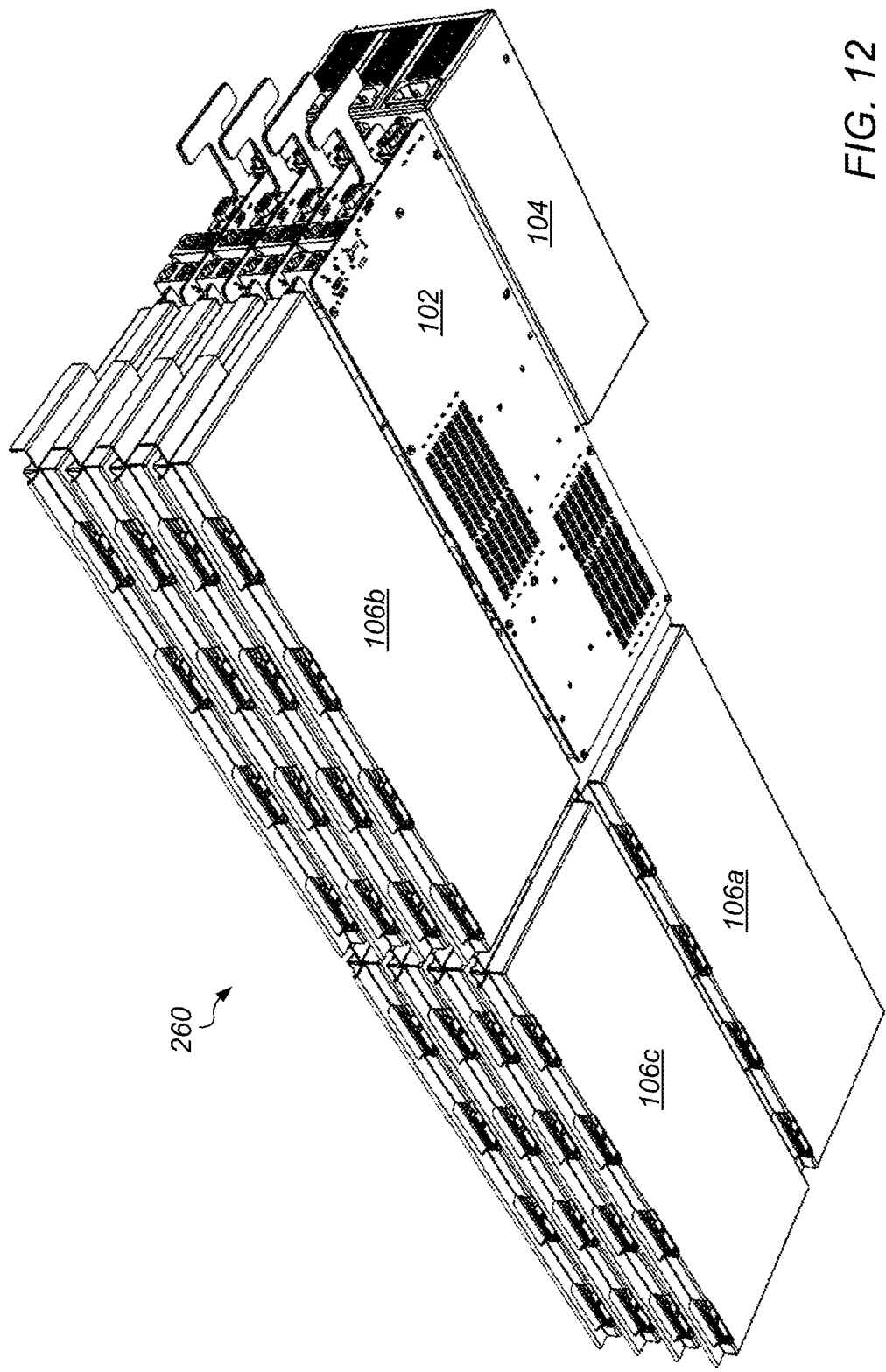
FIG. 12 illustrates one embodiment of a computing system including compute modules and two-deep data storage modules

In some embodiments, a computing system includes data storage module assemblies arranged two or more data storage modules deep in a rack. FIG. 12 illustrates one embodiment of a computing system including compute modules and two-deep data storage modules. System 260 includes compute modules 102, power module 104, and data storage modules 106. System 260 may be installed in shelf module, such as described above relative to FIG. 7. Each of data storage modules 106a may be coupled to one of compute modules 102 to form module assembly 262. Each of data storage modules 106b may be coupled to a corresponding one of data storage modules 106c to form module assembly 264. Each of module assemblies 262 and module assemblies 264 may be separately removable from a shelf module for system 260.

Figure 13:
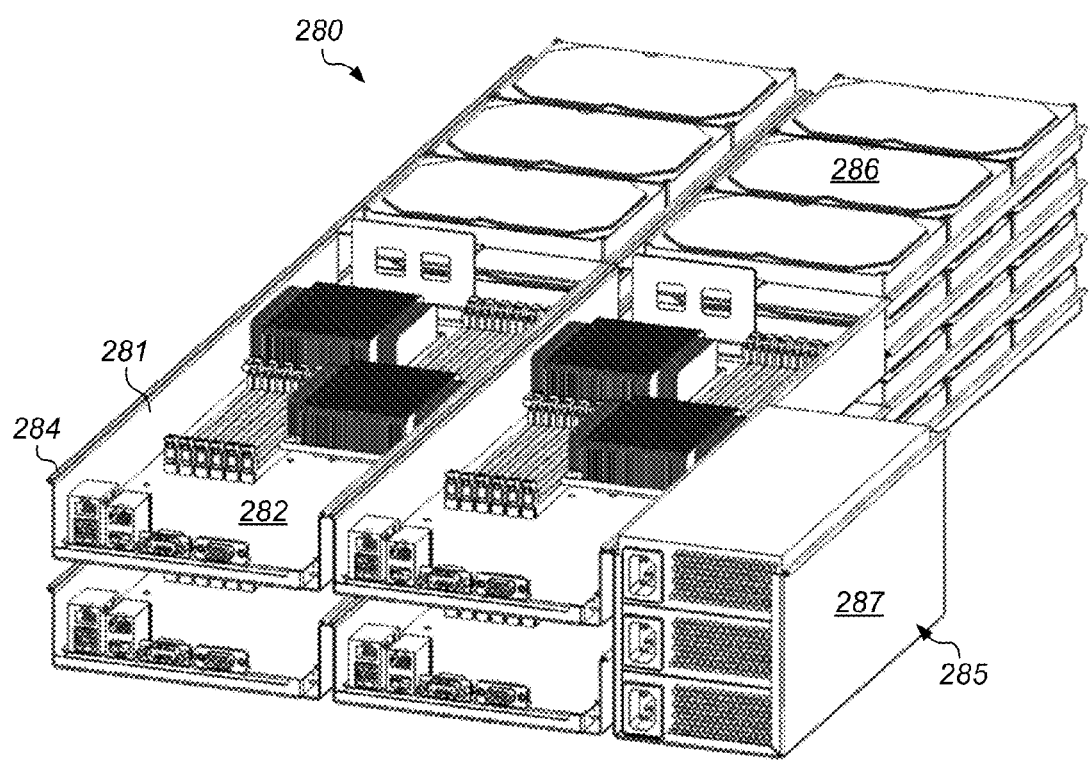
FIG. 13 illustrates one embodiment of a rack installation of computing devices and a power supply module having different heights.

In some embodiments, different devices installed over the width of one or more slots of a rack have different heights from one another. In certain embodiments, devices may combine across the width of the rack to fill a given number of slots in the rack. FIG. 13 illustrates one embodiment of a rack installation of computing devices and a power supply module having different heights. System 280 includes computing devices 281 and power supply module 285. Each of computing devices 281 includes a motherboard assembly 282 and chassis 284. In one embodiment, each of hard disk drive stacks 286 includes six 3.5 inch drives (3 stacks, each stack two high). Thus, each stack of two computing devices 281 creates a stack of hard disk drives four drives high.

Power supply module 285 includes a stack of three power supply units. The power supply units are held in power supply carrier 287. In one embodiment, each of the power supply units is a 1 U power supply unit. Power supply module 285 may supply power to computing devices 281.

Figure 14:
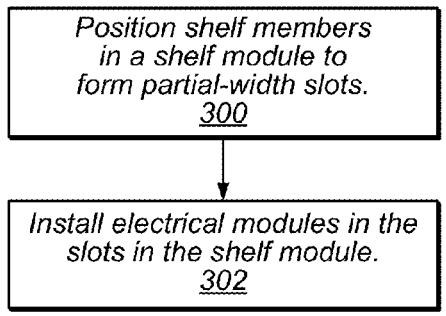
FIG. 14 illustrates one embodiment of providing computing resources using a configurable shelf module.

In some embodiments, providing computing resources (for example, in a data center) includes positioning shelf members in a shelf module to create partial width slots in the shelf module. Electrical modules, such as compute modules, data storage modules, and power modules, may be installed in the slots. FIG. 14 illustrates one embodiment of providing computing resources using a configurable shelf module. At 300, shelf members are positioned in a shelf module to form two or more partial width slots in the shelf module. In some embodiments, shelf members are positioned to adjust a height of a partial width slot. In some embodiments, shelf members are positioned to adjust a width of a partial width slot. The sizes and arrangement of the slots may be based on a particular set of electrical modules to be used in the computing system.

At 302, electrical modules are installed in two of the slots in the shelf module. In one embodiment, one or more compute modules, one or more data storage modules, and one or more power modules are installed in the configured slots.

In certain embodiments, a shelf module is re-configured to create slots for installing of a different set of electrical modules. For example, a shelf module may be re-configured from the slot arrangement shown in FIG. 1 to the slot arrangement shown in FIG. 11.

In some embodiments, separately mountable electrical modules are provided for a rack. The modules may include one or more functional modules, such as a compute module, a data storage module, and a power module. The modules may be coupled to form one or more module assemblies before being installed in the rack. In some embodiments, the electrical modules are installed in a shelf module.

Figure 15:
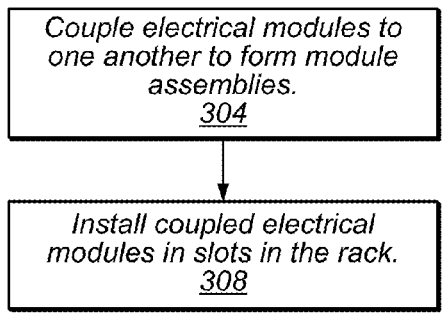
FIG. 15 illustrates providing computing resources with electrical modules coupled to one another and installed a rack.

FIG. 15 illustrates providing computing resources with electrical modules coupled to one another and installed a rack. At 304, electrical modules are coupled to one another to form one or more module assemblies. Each of the electrical modules may have its own chassis. In some embodiments, each of the electrical modules includes mounting portions, such as guides or tabs, such that the electrical module can be separately installed in a rack (for example, on rails in a shelf module).

In some embodiments, coupled modules form a computing system from one or more functional modules. For example, a compute module may be coupled to one or more data storage modules. Power and data connections may be provided between modules in an assembly.

At 308, coupled electrical modules are installed in a slot in the rack. In one embodiment, the coupled electrical modules include mounting portions that mount on rails in a slot of a rack. In some embodiments, the modules are installed in an arrangement two or more deep in the slot.

In various embodiments, modular systems may be implemented to provide a desired combination of computing, data storage, and other resources or capacities. The following are examples of rack systems that may be deployed.

Compute Option: 1½ RU compute modules, up to 4 hard disk drives per socket storage. The rack system may include up to 13 3 U shelves, for a total of up to 52 servers or 104 nodes per rack. A 3 power supply unit power block is provided with distributed 12V at the shelf level, 2N+Reserve power. One embodiment of a module arrangement for a compute option is shown in FIG. 13.

Data Storage Option: ¾ RU compute module. The compute modules may have lower power processing than in the preceding example. 16 hard disk drive per RU disk density, or 624 hard disk drives per rack and either 12 or 6 hard disk drives per CPU socket ratio. A 3 power supply unit power block is provided with distributed 12V at the shelf level, 2N+Reserve Power. One embodiment of a module arrangement for a data storage option is shown in FIG. 1.

In various embodiments, different combinations of data storage modules may be combined to create data storage assemblies. For example, as illustrated in FIG. 1, a 2-drive module may be combined with a 3-drive module to form a 5-drive module.

In some embodiments, two or more coupled electrical modules are installed in a shelf module that has been configured to receive coupled electrical modules. For example, shelf members may be positioned in a shelf frame to form a suitable arrangement of slots for receiving the coupled electrical modules.

In some embodiments, different modules in a shelf module have different heights. For example, in the embodiment shown in FIG. 1, each of the four compute modules in the left most and center columns is about ¾ U. The power module in the right-most column includes three power supply modules each about 1 U, such that the power module is about 3 U in height.

In some embodiments, resources for electrical components in a rack are allocated based on the amount of space for the components. Resources for electrical components that may be allocated based on space include electrical power, cooling resources such as airflow, and data input/output capacity. For each resource, a budget may be established for a defined amount of rack space (for example, a defined amount of rack space may be 3 rack units and the full width of a standard slot). Electrical modules (such as compute modules, data modules, and power modules) may be deployed within a particular space to stay within the budget for each resource for the particular space.

Figure 16:
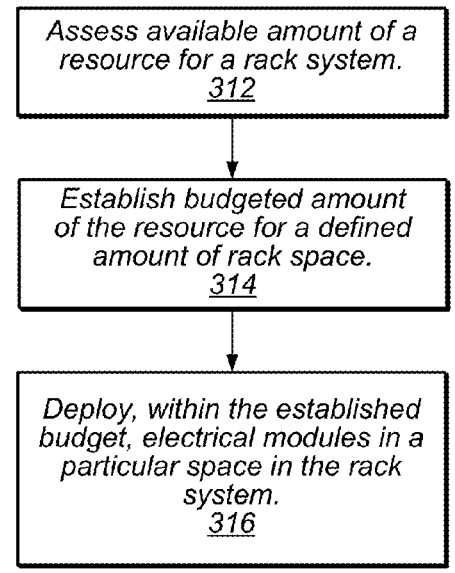
FIG. 16 illustrates one embodiment of allocating resources in a rack system based on space.

FIG. 16 illustrates one embodiment of allocating resources in a rack system based on space. At 312, an available amount of a resource for a rack system is assessed. For example, a rack system may have 15 kVA of electrical power available for electrical components in the rack system. As another example, a rack system may have a total of 1,700 cubic feet per minute of airflow available.

At 314, a budgeted amount of a resource is established for a defined amount of rack space in a rack system. A defined amount of rack space may be, for example, an amount of space in a standard rack. A defined amount of rack space may be, for example, 3 U full width, 3 U half width, ¾ U full width, or ¾ U half width. In certain embodiments, rack space is allocated based on an increment that is a multiple of ¼ rack units. In some embodiments, an amount of a resource is budgeted for an amount of space available in a shelf module (or in a portion of a shelf module, such as one-half of the shelf module, or a particular slot in the shelf module).

At 316, electrical modules are deployed in a particular space in the rack system having the defined amount of rack space. The resources may be deployed such that the amount of the resource used by the electrical modules in the particular rack space is maintained within the budgeted amount of the resource. In some embodiments, each slot in a shelf module or rack system is held within budget for the resource. In certain embodiments, two or more slots are held in combination with in the resource budget for the space. For example, the sum of electrical power required for all of the electrical modules in a 3 U, full width shelf module may be maintained within an established electrical power budget for the shelf module.

In some embodiments, one or more electrical modules or module assemblies are maintained within the budgeted amount for the electrical modules by over-allocating space to one or more electrical modules in the particular space. For example, if the electrical power budget for each ¾ U, half-width space is 150 watts, but an ¾ U, half-width computing module that is actually to be deployed requires 300 watts of electrical power, then the deployed unit compute module may be given two ¾ U, half width slots in the deployed space instead of one ¾ U, half-width slot. By allocating the 300 watt compute module two slots, the rack system may be maintained within the electrical power budget for the particular space.

In some embodiments, a resource is allocated to space in increments that are a multiple of a standard measure of a height within a rack, such as a rack unit. In one embodiment, a resource is allocated in ¼ rack unit increments. For example, each ¼ rack unit, half-width space may be budgeted 50 watts of electrical power. To deploy a ¾ U, half-width compute module that requires 200 watts of electrical power, the compute module would be allocated a 1 U, half width slot (4×¼ Upper 50 watts).

Spacing of electrical modules or module assemblies to maintain budget within a particular space in a rack may be accomplished allocating additional height, additional width, or allocating a combination of additional height and additional width. For example, for the ¾ U, half-width compute module described above, the 300 watt power consumption for the actual ¾ U, half-width compute module was twice the electrical power budget for a ¾ U, half-width space. Budget could be maintained by leaving an open ¾ U half-width slot above or below the compute module, or by leaving an open ¾ half width slot next to the compute module. In certain embodiments, spacing elements, such as blanking plates, may be deployed in a rack space to maintain spacing of electrical modules within a resource budget for the space.

In certain embodiments, electrical modules are physically sized based on a resource budget for the space in which the electrical modules will be deployed. For example, in the example described above in which each ¼ U, half-width increment is allocated 50 watts, electrical modules may be physically sized as follows: a 150 watt compute module provided in a ¾ U, half-width size (3×¼ U); a 200 watt compute module provided in a 1 U, half-width size (4×¼ U); and a 300 watt compute module provided in a 1.5 U, half-width size (6×¼ U).

In some embodiments, electrical modules are deployed within rack space in a manner that inhibits service personnel from inadvertently exceeding the amount of a resource available for the particular space. In one embodiment, electrical modules are physically sized to inhibit service personnel from inadvertently exceeding the amount of a resource available for the particular space. In certain embodiments, some or all of the modules in a rack may have a form that is physically larger than the space required for the electrical components in the module. For example, a compute module that requires 100 watts of electrical power may take up a 1 U slot even though the components for compute module only take up ¾ rack units of height. Oversized modules may keep maintenance personnel from inadvertently overloading a particular space in rack with modules that exceed the resources available for the particular space. In certain embodiments, extension plates or wings may be attached to an electrical module to increase the effective amount of effective rack space the electrical module takes up.

Although embodiments have been described in terms of a budget for electrical power, budget may be allocated based on rack space for any number of resources. Other resources that may be budgeted as describe above include cooling resources, such as airflow, and data input/output capacity. In certain embodiments, resource budgets are established, and electrical modules are deployed, based on rack space for each of two or more different resources.

Figure 17:
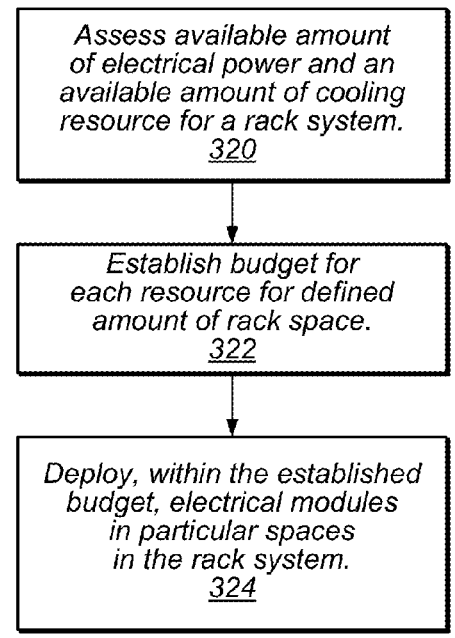
FIG. 17 illustrates an embodiment that includes establishing resource budgets for electrical power and a cooling resource.

FIG. 17 illustrates an embodiment that includes establishing resource budgets for electrical power and a cooling resource. At 320, an available amount of electrical power and an available amount of cooling resource for a rack system is assessed. Table 1 illustrates one example of available amounts for power and airflow for a rack.

TABLE 1

| Power Domain | | Power (W) | dT | Airflow (CFM) |
| --- | --- | --- | --- | --- |
| Rack | | 14250 | 15 | 1642.76 |
| Full Width | 3U Shelf | 1096 | 15 | 126.37 |
| | 1.5U | 548 | 15 | 63.18 |
| | 0.75U | 274 | 15 | 31.59 |
| Half Width | 1.5U | 274 | 15 | 31.59 |
| | 0.75U | 137 | 15 | 15.80 |

In some embodiments, available amounts may include a utilization factor or margin of safety. For example, the 4,250 watts of power for the rack shown in Table 1 may be based on a 95% utilization of power in a rack having a maximum theoretical rack power of 15 KVA. In the example shown in Table 1, cooling resource availability is defined in terms of airflow and a given temperature differential, in this case 15 degrees Fahrenheit.

At 322, a budget is established for each of the resources for one or more defined amounts of rack space in the rack system. For example, a 3 U, full width shelf has a budget of 1096 watts of electrical power and 126.37 cubic feet per minute of airflow. The budget for each of the resources may be a proportion of the total available amount of the resource for the whole rack.

At 324, electrical modules are deployed particular spaces (for example, shelf modules) in the rack system. The electrical modules may be deployed such the amount of electrical power resources used by the electrical modules in each particular rack pace is maintained within the budgeted amount of the electrical power resource, and such that the amount of the cooling resources used by the electrical modules in each particular rack space is maintained within the budgeted amount of the cooling resource.

Figure 18:
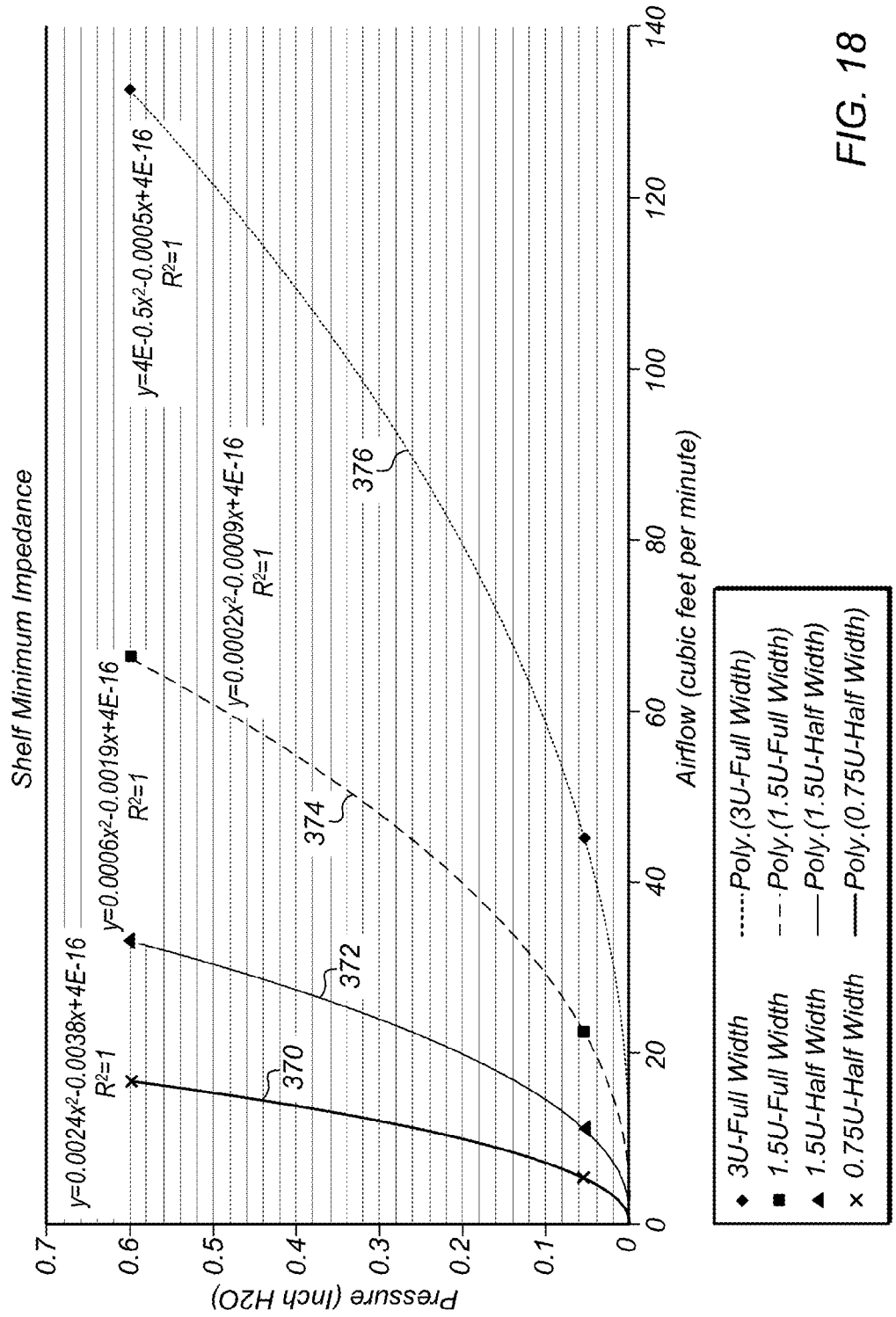
FIG. 18 illustrates one example of a set of minimum impedance curves for a cooling air allocation.

In some embodiments, to achieve a desired airflow in a rack, each shelf is restricted to a minimum impedance curve. In certain embodiments, airflow impedance calculation is based on an N+1 redundancy for the rack. FIG. 18 illustrates one example of a set of minimum impedance curves for a cooling air allocation. Each curve may be based on a polynomial curve fit for a different defined rack space. For example, curve 370 may correspond to a minimum impedance curve for a 0.75 U, half-width space, curve 372 may correspond to a minimum impedance curve for a 1.5 U, half-width space, curve 374 may correspond to a minimum impedance curve for a 1.5 U, full-width space, and curve 376 may correspond to a minimum impedance curve for a 3.0 U, full-width space.

In some embodiments, filler elements are installed in one or more slots or spaces in a rack or shelf module. Filler elements may be, for example, a dummy module or a blanking panel. In certain embodiments, a filler element may filler plate attached to secured a functional module. The filler element may be used to increase impedance for one or more spaces in the rack or shelf. In some embodiments, a filler element works in combination with one or more functional modules, such as a a compute module or storage module, to a minimum impedance level for a particular space in a rack or a shelf module.

In some embodiments, rack-mounted electrical modules are cooled by a cooling air system that delivers air in bulk to the rack. To remove heat from electrical modules installed in the rack, an air handling system may be operated to cause air to flow in computer room and through the rack system. As the air reaches the front of each of computing devices, the air may pass through the chassis of the computing devices. After passing through the chassis, the heated air may exit the rear of the rack system and flow out of the computer room. In certain embodiments, computing devices may have on board fans in addition to, or lieu of, a central cooling system. In certain embodiments, a rack may have a fan that supplies cooling air to all of the computing devices in the rack.

In certain embodiments, an electrical module or shelf module may include one or more internal fans to promote the flow of air through electrical modules. For example, in certain embodiments, fans are provided along the rear edge of compute module or data storage module. Fans may move air across heat producing components of electrical modules. In certain embodiments, an electrical module has no fans.

Figure 19:
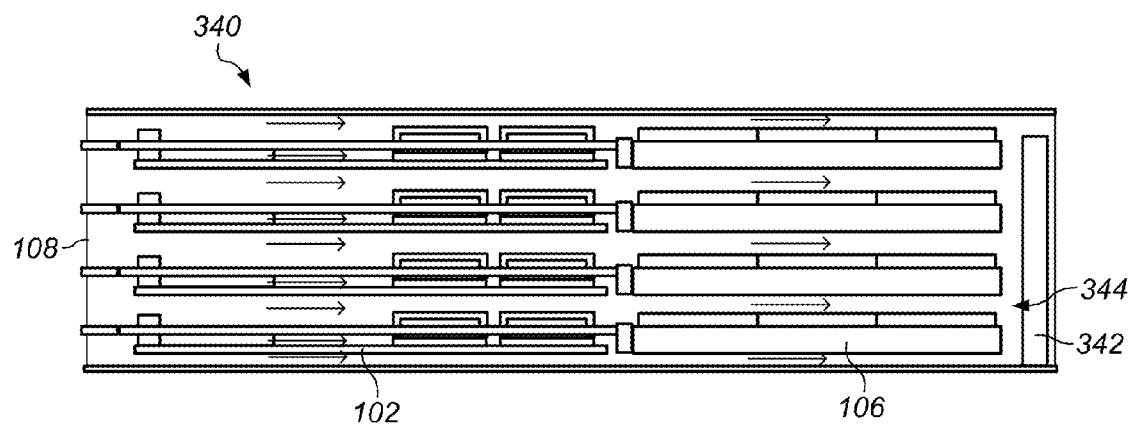
FIG. 19 is a side view illustrating one embodiment of cooling air flow in a rack system including electrical modules.

FIG. 19 is a side view illustrating one embodiment of cooling air flow in a rack system including electrical modules. Computing system 340 includes compute module 102, data storage module 106, and fan 342.

The arrows shown in FIG. 19 indicate possible air flow paths in the rack in a front-to-back air flow arrangement. Air gaps 344 may be provided between the upper and lower tiers of compute modules 102 and data storage modules 106. Air gaps may allow air flow across heat producing components of compute modules 102 and data storage modules 106, such as hard disk drives of data storage modules 106.

In certain embodiments, an on-board fan may provide cooling for two or more tiers of electrical modules in a rack. For example, on-board fan 342 at the rear of shelf module 108 may provide cooling for computing devices in both the upper and lower tiers of modules installed in shelf module 108. In one embodiment, the height of the on-board fan is between 1.5 U and 3 U.

Figure 20:
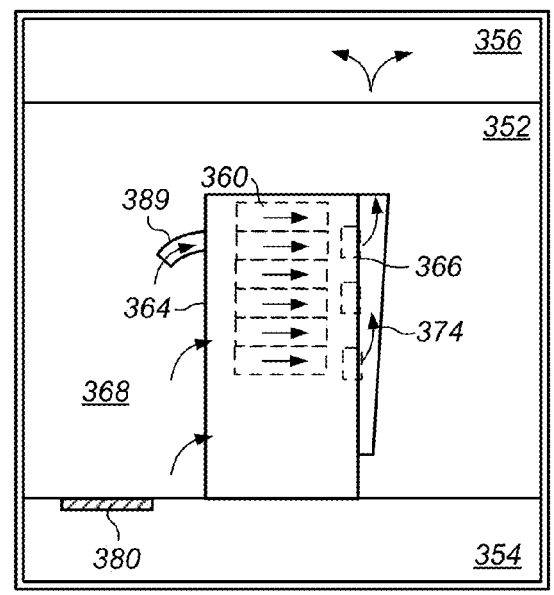
FIG. 20 illustrates one embodiment of removal of heat from computing devices in a computing system.

FIG. 20 illustrates one embodiment of removal of heat from computing devices in a computing system. Air may pass into computing room 352 from sub-floor plenum 354 by way of vent 380. Rear fans 366 in fan door 374 may draw air from front aisle 368 into rack 364, and through computing devices 360. Rear fans 366 may exhaust heated air out of the rack. The heated air may pass into ceiling plenum 356. Air directing device 389 is provided on the front or rack. Air directing device 389 may be used to promote airflow in particular devices mounted in the rack. Other arrangements of air movers may be included in various embodiments. U.S. patent application Ser. No. 12/646,417, "Air Directing Device for Rack System", filed Dec. 23, 2009; U.S. patent Ser. No. 12/751,212, "Rack-Mounted Air Directing Device with Scoop", filed Mar. 30, 2010; and U.S. patent application Ser. No. 12/886,440, "System with Rack-Mounted AC Fans", filed Sep. 9, 2010, each of which is incorporated by reference as if fully set forth herein, include other arrangements, systems, devices, and techniques that may be used in various embodiments for cooling or mounting computing devices, data storage devices and data control devices.

In various embodiments described above, each of the processors may operate as a separate compute node. In certain embodiments, however, circuit board assemblies on a dual-processor board may cooperate to function as a single compute node. In certain embodiments, two or more processors on a multiple processor circuit board assembly share access to some or all of the hard disk drives in a compute module.

Although in the embodiments described above, the hard disk drives were mounted on directly to chassis members, in various embodiments, hard disk drives or other data storage devices may be mounted to a chassis using other mounting elements. For example, hard disk drives may be mounted on square tubes that support the drives and raise the drives above the bottom of a chassis.

In some embodiments, a rack system includes rack-mounted fans external to computing devices in the rack. The rack-mounted fans may provide air flow through the computing devices.

Although in the embodiments described above, some of the computer modules have been described as being 0.75 U, 1.5 U, and 3 U in height, modules may in various embodiments be 2 U, 4 U, 5 U, or 6 U or any other height or dimensions.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A modular computing system, comprising:
   two or more electrical modules, comprising:
      one or more compute modules comprising:
         a compute module chassis comprising one or more shelf mounting portions configurable to slide the one or more compute modules into at least one slot of a rack;

one or more circuit board assemblies coupled to the compute module chassis; and
one or more processors coupled to at least one of the circuit board assemblies;
one or more data storage modules comprising:
a data storage module chassis comprising one or more shelf mounting portions configurable to slide the data storage module into at least one slot of the rack; and
one or more data storage devices coupled to the data storage module chassis; and
one or more power modules comprising:
a power module carrier comprising one or more shelf mounting portions configurable to slide the one or more power modules into at least one slot of the rack; and
one or more data storage devices coupled to the power module carrier; and
a shelf module configured for installation in a rack, the shelf module comprising two or more partial width slots configurable to slidably receive at least one of the compute modules, at least one of the data storage modules, and at least one of the power modules,
wherein at least two of the electrical modules are configured to physically couple with one another to form a module assembly independently of the rack, wherein the shelf module is configurable to receive the module assembly of physically coupled electrical modules in at least one of the slots in the shelf module via the one or more shelf mounting portions of each of the at least two physically coupled electrical modules.

2. The computing system of claim 1,
wherein each of at least one of the slots in the shelf module comprises rail portions configurable to support an electrical module in the slot,
wherein at least one of the compute modules and at least one of the other electrical modules each comprise one or more guide portions configured to couple on the rail portions of the slots in the shelf module,
wherein the guide portions and the rail portions are configured such that at least one of the different ones of the electrical modules interchangeably couple on the rail portions in the slot.

3. The computing system of claim 1, wherein the shelf module is configurable to alter a size of at least one of the slots.

4. The computing system of claim 1, wherein the shelf module is configurable to alter a height of at least one of the slots in increments that are a multiple of ¼ rack units.

5. The computing system of claim 1, wherein at least two of the electrical modules comprises complementary coupling portions configured to couple the at least two electrical modules with one another.

6. The computing system 1, wherein at least one of the data storage modules is configured to physically couple to at least one of the compute modules.

7. The computing system of claim 1, wherein the coupled modules are configured to be installed in one of the slots in the shelf module.

8. The computing system of claim 7, wherein the coupled modules are configured for installation at least two deep in the slot.

9. A modular computing system, comprising:
two or more electrical modules, each of at least two of the electrical modules comprising:
a module chassis comprising one or more shelf mounting portions configurable to slide the electrical module into a slot of a rack; and
one or more electrical components coupled to the chassis;
wherein the at least two of the electrical modules are configured to physically couple with one another to form a module assembly independently of the rack, and
wherein the module assembly of physically coupled electrical modules is configured to slide into one or more slots in the rack.

10. The computing system of claim 9,
wherein at least one of the slots in the rack is a slot in a shelf module installed in the rack;
wherein each of at least one of the slots in the shelf module comprises rail portions configurable to support an electrical module in the slot,
wherein at least two of the electrical modules comprise one or more guide portions configured to couple on the rail portions of the slots in the shelf module,
wherein the guide portions and the rail portions are configured such that at least two of the different ones of the electrical modules interchangeably couple on the rail portions in the slot.

11. The computing system of claim 9, wherein at least one of the slots in the rack is a slot in a shelf module installed in the rack.

12. The computing system of claim 11, wherein the shelf module comprises at least one vertical partition that is movable to alter a width of at least one partial width slot in the shelf module.

13. The computing system of claim 9, wherein at least one of the slots in the rack is a partial width slot.

14. The computing system of claim 9, wherein at least one of the coupled modules in the module assembly is a compute module, wherein at least one of the coupled modules in the module assembly is a data storage module.

15. The computing system of claim 9, wherein at least two of the electrical modules in the module assembly comprise complementary coupling portions, wherein the complementary coupling portions are configurable to couple the electrical modules with one another.

16. The computing system of claim 9, wherein at least two of the electrical modules in the module assembly comprise complementary electrical power coupling portions and complementary data coupling portions, wherein the complementary electrical power coupling portions are configurable to provide an electrical power connection between the coupled electrical modules, wherein the complementary data coupling portions are configurable to provide a data connection between the coupled electrical modules.

17. The computing system of claim 9, wherein at least two of the electrical modules in the module assembly comprise guide portions configured to couple on rail portions of a slot in the rack when the module assembly is installed in the rack.

18. The computing system of claim 17, wherein the guides for at least one of the electrical modules in the module assembly are provided on the module chassis of the electrical module.

19. The computing system of claim 9, wherein the module assembly is configured to couple in a slot having a height that is a multiple of ¼ U.

20. The computing system of claim 9, wherein the module assembly is configured to couple in a slot having a height that is a multiple of ¾ U.

21. The computing system of claim 9, wherein the coupled modules are configured for installation at least two deep in the slot from front to back.

22. The computing system of claim 9, wherein at least one of the electrical modules comprises:
   a compute module comprising:
      a compute module chassis;
      one or more circuit board assemblies coupled to the compute module chassis; and
      one or more processors coupled to at least one of the circuit board assemblies.

23. The computing system of claim 9, wherein at least one of the electrical modules comprises:
   a data storage module comprising:
      a data storage module chassis; and
      one or more data storage devices coupled to the data storage module chassis.

24. The computing system of claim 9, wherein at least one of the electrical modules comprises:
   a power module comprising:
      a power module carrier; and
      one or more power supply devices coupled to the power module carrier.

25. An electrical module, comprising:
   a module chassis comprising one or more shelf mounting portions configurable to mount the electrical module on a shelf;
   one or more electrical components coupled to the chassis; and
   one or more coupling portions configurable to physically couple the electrical module with one or more other electrical modules into a module assembly independently of a rack, wherein the electrical modules are configurable to physically couple such that the module assembly is configured to be installed in a slot in the rack.

26. The electrical module of claim 25, wherein the chassis comprises a sled, wherein the one or more mounting portions are included in the sled, wherein at least one of the electrical components is coupled to the sled.

27. The electrical module of claim 25, wherein the electrical module comprises a data storage module comprising shelf-mounting portions, wherein the data storage module comprises one or more coupling portions configurable to couple the data storage module with a compute module.

28. A compute module, comprising:
   a compute module chassis comprising one or more mounting portions configured to mount at least the compute module in a rack;
   one or more circuit board assemblies coupled to the compute module chassis;
   one or more processors coupled to at least one of the circuit board assemblies; and
   one or more data storage devices coupled to the compute module chassis,
   wherein the compute module is configured to physically couple with one or more separate electrical modules, independently of the rack, to establish a module assembly of physically coupled modules, such that the module assembly is configured to be installed in a slot in the rack, via the one or more mounting portions of the compute module and a separate one or more mounting portions of the one or more separate electrical modules.

29. The compute module of claim 28, further comprising one or more low profile DIMMs coupled to the circuit board assembly, wherein the compute module including the low-profile DIMMs is configured for installation in a ¾ U slot in a rack.

30. The compute module of claim 28, wherein the compute module chassis comprises one or more cut-outs for at least some of the DIMMs.

31. The compute module of claim 28, wherein the one or more data storage devices comprise one or more 3.5 inch hard disk drives, wherein the compute module including the one or more 3.5 inch hard disk drives is configured for installation in a ¾ U slot in a rack.

32. A method of providing computing resources, comprising:
   physically coupling two or more electrical modules to one another, independently of a rack, to form one or more module assemblies, wherein each of at least two of the physically coupled electrical modules in at least one of the module assemblies comprise separate mounting portions configured to mount on rails in a slot of the rack; and
   subsequently to physically coupling the two or more electrical modules to one another, installing the physically coupled at least two electrical modules in the slot in the rack.

33. The method of claim 32, wherein coupling two or more electrical modules to one another to form one or more module assemblies comprises coupling a compute module comprising a compute module chassis to a data storage module comprising a data storage module chassis.

34. The method of claim 32, wherein coupling two or more electrical modules to one another to form one or more module assemblies comprises coupling two or more power modules each comprising a power module carrier to one another.

35. The method of claim 32, wherein coupling two or more electrical modules to one another to form one or more module assemblies comprises coupling two or more data storage modules each comprising data storage module chassis to one another.

36. The method of claim 32, wherein at least two of the coupled electrical modules are installed in a two-deep arrangement in one slot of the rack.

37. The method of claim 32, wherein the slot comprises a height that is a multiple of ¼ of a rack unit.

38. The method of claim 32, wherein the slot comprises a height that is a multiple of ¾ of a rack unit.

39. The method of claim 32, further comprising adjusting the size of the slot before installing the coupled electrical modules in the slot.

40. The method of claim 39, wherein the slot is adjusted in an increment of a multiple ¼ rack units.

41. The method of claim 39, wherein adjusting the size of the slot comprises adjusting one or more shelf members in a shelf module.

42. The method of claim 32, wherein at least a first one of the module assemblies has a different height than at least a second one of the module assemblies, wherein at least the first one of the modules and at least the second one of the electrical modules are configured to mount in slots that are each a multiple of ¼ rack units.

43. The method of claim 32, wherein installing at least two of the coupled electrical modules on rails in the slot in the rack comprises:
   coupling two or more electrical modules having a first height in the rack in a first stack of electrical modules,
   coupling two or more electrical modules having a second height in a second stack of electrical modules, wherein the level of the first stack in the rack coincides or overlaps with the level of the second stack in the rack, wherein the first height is different from the second height.

* * * * *